US012765379B2

(12) United States Patent
Joshua et al.

(10) Patent No.: US 12,765,379 B2
(45) **Date of Patent: *Oct. 13, 2026**

(54) PRESSURE RELIEF VALVE AND ADSORBENT CHAMBER FOR TWO-PHASE IMMERSION COOLING SYSTEMS AND METHODS FOR USING SAME

(71) Applicant: MTS IP Holdings Ltd, Grand Cayman (KY)

(72) Inventors: Nihal Joshua, Niagara Falls (CA); Jason Samuel, Cedar Park, TX (US); Ioannis Manousakis, Zürich (CH)

(73) Assignee: MTS IP Holdings Ltd, George Town (KY)

(*) Notice: Subject to any disclaimer, the term of this patent is extended or adjusted under 35 U.S.C. 154(b) by 341 days.

This patent is subject to a terminal disclaimer.

(21) Appl. No.: 18/432,342

(22) Filed: Feb. 5, 2024

(65) Prior Publication Data

US 2024/0404916 A1 Dec. 5, 2024

Related U.S. Application Data

(63) Continuation of application No. 18/325,971, filed on May 30, 2023, now Pat. No. 11,894,288, which is a (Continued)

(51) Int. Cl.
*H05K 1/02* (2006.01)
*B01D 53/26* (2006.01)
(Continued)

(52) U.S. Cl.
CPC .......... *H10W 40/73* (2026.01); *B01D 53/261* (2013.01); *F16K 15/028* (2013.01); (Continued)

(58) Field of Classification Search
CPC ............... H05K 7/203; H05K 7/20818; H05K 7/20327; H05K 7/20381; H05K 7/208; (Continued)

(56) References Cited

U.S. PATENT DOCUMENTS 10,966,349 B1 3/2021 Lau
11,589,483 B1 * 2/2023 Lee .................... H05K 7/20318
(Continued)

OTHER PUBLICATIONS

CD-PR5005.B—One-Way-Pressure-Relief-Valve, https://stratotechvalve.com/product/pr5005-pressure-relief-valve/, Jun. 27, 2022, accessed on Mar. 28, 2023, 1 page.
(Continued)

*Primary Examiner* — Mandeep S Buttar
(74) *Attorney, Agent, or Firm* — Smith Baluch LLP

(57) ABSTRACT

A pressure relief valve for a two-phase immersion cooling system is configured to support fluid flow rates up to 500 cfm, 550 cfm, 600 cfm, or even 2000 cfm. This, in turn, allows the cooling system to support computing systems with a power density greater than 250 kW. This is accomplished by the valve having a relatively large passage (e.g., 2-6 inch diameter), a relatively large spring (e.g., 1.5-1.7 inch diameter), and a guide rod rigidly coupled to the poppet and slidably coupled to a guide plate. The valve may be used as an outlet valve and coupled to an adsorbent chamber to reduce the loss of coolant from the system as air is vented to an ambient environment. The valve may be used as an inlet valve and coupled to an adsorbent chamber to reduce the intake of water vapor as air from the ambient environment flows into the system.

20 Claims, 21 Drawing Sheets

Related U.S. Application Data continuation of application No. PCT/US2023/067598, filed on May 30, 2023.

(51) Int. Cl.

| | |
|---|---|
| ***F16K 15/02*** | (2006.01) |
| ***F16K 15/06*** | (2006.01) |
| ***F16K 17/04*** | (2006.01) |
| ***F16K 17/08*** | (2006.01) |
| ***F16K 24/04*** | (2006.01) |
| ***F28C 3/08*** | (2006.01) |
| ***H05K 7/20*** | (2006.01) |
| ***H10W 40/73*** | (2026.01) |
| ***H10W 40/77*** | (2026.01) |

(52) U.S. Cl.

CPC .......... *F16K 15/065* (2021.08); *F16K 15/067* (2021.08); *F16K 17/0413* (2013.01); *F16K 17/087* (2013.01); *F16K 24/04* (2013.01); *F28C 3/08* (2013.01); *H05K 1/0203* (2013.01); *H05K 7/20327* (2013.01); *H05K 7/20809* (2013.01); *H10W 40/772* (2026.01); *B01D 2257/80* (2013.01)

(58) Field of Classification Search

CPC ........... H05K 7/20236; H05K 7/20281; H05K 7/20772; F16K 17/196; F16K 24/00; F16K 37/0041; F16K 1/221; F16K 11/0712; F16K 15/026; F16K 17/0413; F16K 7/17; F16K 31/385; F16K 31/365; F28D 15/0266

See application file for complete search history.

(56) References Cited

U.S. PATENT DOCUMENTS

| | | | | |
|---|---|---|---|---|
| 2004/0007268 | A1 | 1/2004 | Bridges et al. | |
| 2014/0216688 | A1 | 8/2014 | Shelnutt et al. | |
| 2016/0202708 | A1 | 7/2016 | Hurst et al. | |
| 2018/0042138 | A1 | 2/2018 | Campbell et al. | |
| 2019/0170406 | A1 | 6/2019 | Wilson et al. | |
| 2020/0093032 | A1 | 3/2020 | Enright et al. | |
| 2020/0093038 | A1 * | 3/2020 | Enright .............. | H05K 7/20318 |
| 2021/0155476 | A1 | 5/2021 | Futerman et al. | |
| 2021/0274677 | A1 | 9/2021 | Enright et al. | |
| 2022/0369493 | A1 | 11/2022 | Alissa et al. | |
| 2023/0027917 | A1 * | 1/2023 | Lin .................... | H05K 7/20327 |

OTHER PUBLICATIONS

International Search Report and Written Opinion in International App. No. PCT/US2023/067598 dated Jan. 12, 2024, 12 pages.

Stratotech LLC—PR5005, https://stratotechvalve.com/product/pr5005-pressure-relief-valve/, Jul. 19, 2022, accessed on Mar. 28, 2023, 2 page.

* cited by examiner

PRESSURE RELIEF VALVE AND ADSORBENT CHAMBER FOR TWO-PHASE IMMERSION COOLING SYSTEMS AND METHODS FOR USING SAME

CROSS-REFERENCE TO RELATED PATENT APPLICATION

The present application is a continuation of U.S. application Ser. No. 18/325,971, filed May 30, 2023, entitled "PRESSURE RELIEF VALVE AND ADSORBENT CHAMBER FOR TWO-PHASE IMMERSION COOLING SYSTEMS AND METHODS FOR USING SAME," which is a bypass continuation of International Application No. PCT/US2023/067598, filed on May 30, 2023, entitled "PRESSURE RELIEF VALVE AND ADSORBENT CHAMBER FOR TWO-PHASE IMMERSION COOLING SYSTEMS AND METHODS FOR USING SAME." Each of the aforementioned applications is incorporated herein by reference in its entirety.

BACKGROUND

Two-phase immersion cooling is a liquid cooling technique that utilizes a liquid-to-gas phase transition to remove heat from a heat-generating component, such as a processor of a computing system. This is typically accomplished using a tank to submerge the heat-generating component in a pool of coolant liquid where the coolant liquid is a dielectric with a relatively low boiling point (e.g., 50° C.). During operation, the coolant liquid in direct contact with the heat-generating component vaporizes, producing coolant vapor that rises upwards within the tank. The coolant vapor thereafter transfers heat to a heat exchanger disposed above the coolant liquid, thus causing the coolant vapor to condense back to a liquid and thereafter fall into the pool of coolant liquid below. A two-phase immersion cooling system is often used to cool high density computing systems, such as an array of servers in a data center.

As an illustrative example, FIGS. 1A and 1B show a representative two-phase immersion cooling system 10. As shown, the system 10 includes a tank 11 defining a tank volume 12 to contain coolant liquid 20 and one or more printed circuit boards (PCBs) 90 with respective semiconductor die 91 submerged in the coolant liquid 20. The system 10 further includes a cooling distribution unit 13 with a condenser coil 14 that carries a secondary coolant. The condenser coil 14 is partially disposed in the tank volume 12 above the coolant liquid 20. During operation, the semiconductor dies 91 generate heat, which is dissipated by the coolant liquid. When the coolant liquid is sufficiently heated, the coolant liquid vaporizes producing coolant vapor 21, which rises above into a gas space 24 within the tank volume 12 containing a mixture 23 of air and coolant vapor. As the coolant vapor 21 physically contacts the condenser coil 14, heat from the coolant vapor 21 is transferred to the secondary coolant carried by the condenser coil 14, thus causing the coolant vapor 21 to condense to liquid droplets 22 that falls back into the coolant liquid 20 below. The secondary coolant is circulated to the cooling distribution unit 13 where the heat is thereafter dissipated from the secondary coolant.

SUMMARY

The Inventors have recognized and appreciated two-phase immersion cooling systems provide an energy efficient approach to cool high density computing systems. However, the Inventors have also recognized conventional two-phase immersion cooling systems have only been demonstrated for relatively low power density computing systems generating less than 250 kilowatts (kW) per enclosure. For relatively high-power computing systems (i.e., computing systems having a power density greater than 250 kW per enclosure), the operating conditions of the immersion cooling system can be appreciably more challenging to manage.

For example, in a two-phase immersion cooling system, the generation of coolant vapor and the heating of air in the tank typically increases the pressure within the tank. When the tank pressure is greater than the ambient pressure, this condition is referred to as overpressure. If not remedied, the tank pressure may continue to increase resulting in failure of the cooling system (e.g., the tank ruptures). Overpressure conditions typically occur during start up, when operating the computing system at a constant load, and/or when increasing load of the computing system.

To reduce the likelihood of an overpressure-related failure, conventional two-phase immersion cooling systems often include an outlet valve configured to open at a predetermined pressure threshold to release a mixture of air and coolant vapor to the ambient environment, thus decreasing the tank pressure. For example, FIG. 1A shows the representative two-phase immersion cooling system 10 includes an outlet valve 15 disposed on a top side of a tank 11. The outlet valve 15 is configured to open only when the tank pressure ($P_{tank}$) is greater than the ambient pressure ($P_{amb}$) and the difference between the tank pressure and the ambient pressure exceeds a predetermined pressure threshold ($P_{thresh, ovp}$).

For high-power computing systems, the higher heat generation rate can lead to a correspondingly higher coolant vapor generation rate. This, in turn, can give rise to an appreciably higher flow rate of air and coolant vapor flowing through the outlet valve when the valve is open (e.g., greater than 50 cubic feet per minute (cfm)). At these high flow rates, conventional outlet valves are susceptible to mechanical instabilities and vibration that can ultimately lead to mechanical failure. Additionally, the high flow rates of air and coolant vapor through the outlet valve can lead to an appreciable loss of coolant, thus requiring frequent replenishment of coolant liquid, which increases operating costs and downtime of the computing system.

In another example, when an outlet valve is opened due to overpressure conditions, air and/or coolant vapor may be lost to the ambient environment, which can also make the two-phase immersion cooling system susceptible to negative pressure conditions. When the computing system shuts down and/or decreases load, the resulting decrease in the heat generation rate and coolant vapor generation rate typically decreases the tank pressure. However, if this occurs after a loss of air and coolant vapor, the tank pressure may decrease below the ambient pressure. This condition is referred to as negative pressure. If the negative pressure is excessive, the cooling system may also fail (e.g., the tank implodes).

To reduce the likelihood of a negative pressure-related failure, conventional two-phase immersion cooling systems often include an inlet valve that is configured to open at a predetermined pressure threshold to allow air from the ambient environment to flow into the tank, thus increasing the tank pressure. For example, FIG. 1B shows the two-phase immersion cooling system 10 includes an inlet valve 16 disposed on a top side of a tank. The inlet valve 16 opens only when the tank pressure ($P_{tank}$) is less than the ambient pressure ($P_{amb}$) and the difference between the tank pressure and the ambient pressure exceeds a predetermined pressure threshold ($P_{thresh,neg}$). However, the air in the ambient environment can sometimes include moisture (e.g., water vapor). If water vapor is transferred into the tank, the water vapor may condense into liquid water that mixes and chemically reacts with the coolant liquid to form undesirable substances. For example, some two-phase immersion cooling systems use fluoroketone as the coolant liquid, which can react with water to form an acid that corrodes the components of the two-phase immersion cooling system and/or the computing system.

In view of the foregoing limitations of conventional two-phase immersion cooling systems, the present disclosure is directed to various inventive implementations of a pressure relief valve that supports relatively high flow rates of fluid when open. For example, the pressure relief valves disclosed herein may support a flow of a mixture of air and coolant vapor at flow rates up to 500 cfm, 550 cfm, 600 cfm, or even 2000 cfm. Additionally, the pressure threshold at which the pressure relief valve begins to open may be relatively low, for example, between about 0.5 pounds per square inch (psi) and about 2 psi. Therefore, in some implementations, the pressure relief valve may be configured to be a high flow, low cracking pressure relief valve. This, in turn, may allow the cooling system to support computing systems with a higher power density (e.g., greater than 250 kW per enclosure at peak power). The present disclosure is also directed to various example implementations of outlet valve assemblies and inlet valve assemblies that include the pressure relief valve and an adsorbent chamber. For the outlet valve assemblies, the adsorbent chamber may reduce or, in some instances, remove coolant vapor in the air released from the tank when the valve is opened under overpressure conditions. For the inlet valve assemblies, the adsorbent chamber may reduce or, in some instances, remove water vapor in the air transferred into the tank when the valve is opened under negative pressure conditions. The pressure relief valve, the outlet valve assembly, and in the inlet valve assembly may be readily integrated into various two-phase immersion cooling systems as described herein. The present disclosure is also directed to various methods of using the pressure relief valve, the outlet valve assembly, the inlet valve assembly, and/or the two-phase immersion cooling system.

In one example implementation, a pressure relief valve for a two-phase immersion cooling system comprises: a valve body defining a passage having a diameter ranging from about 2 inches to about 6 inches; a guide plate, directly coupled to the valve body, having a guide plate opening; and a poppet assembly slidably coupled to the valve body and the guide plate and movable between and including a closed position and an open position. The poppet assembly is configured to prevent a fluid from flowing through the passage at the closed position and allow the fluid to flow through the passage at the open position or between the open position and the closed position. The poppet assembly comprises: a stem slidably coupled to the valve body; a poppet, directly coupled to the stem, having a first side and a second side opposite to the first side where the poppet seals the passage to prevent the fluid from flowing through the passage at the closed position and allows the fluid to flow through the passage at the open position or between the open position and the closed position; and a guide rod directly coupled to the stem, inserted through the guide plate opening to laterally constrain the poppet with respect to the guide plate, and slidably movable with respect to the guide plate. The pressure relief valve also comprises a spring, disposed between the valve body and the poppet assembly, to apply a spring force to the poppet assembly such that the poppet assembly remains at the closed position and only moves from the closed position towards the open position when the fluid applies a first pressure to the first side of the poppet greater than a second pressure applied to the second side of the poppet and a pressure difference between the first pressure and the second pressure is greater than or equal to a pressure threshold corresponding to the spring force. The spring has a diameter ranging from about 1.5 inches to about 1.7 inches.

The diameter of the passage can more narrowly range from about 4 inches to about 6 inches. The pressure threshold can range from about 0.5 pounds per square inch (psi) to about 2 psi. When the poppet assembly is at the open position or between the open position and the closed position, the valve can be configured to allow the fluid to flow through the passage at a rate ranging from about 0 cubic feet per minute (cfm) to about 2000 cfm. More specifically, the valve can be further configured to allow the fluid to flow through the passage at a rate ranging from about 50 cfm to about 600 cfm. The spring can have a resonant frequency less than about 10 Hz. The valve can further comprise a gasket, directly coupled to the poppet and disposed between the poppet and the valve body, to facilitate sealing of the passage when the poppet assembly is at the closed position. The gasket can comprise at least one of butyl rubber, ethylene propylene diene monomer (EPDM) rubber, or nitrile butadiene rubber (NBR). The valve body can comprise a support bridge that extends across a portion of the passage to support the spring and the support bridge can further have a plurality of notches that laterally constrains the spring. The stem can remain slidably movable with respect to the valve body and the guide rod can remain slidably movable with respect to the guide plate when the valve varies in temperature from about 10° C. to about 90° C. The valve does not receive electrical power or an electrical signal to facilitate movement of the poppet assembly between and including the closed position and the open position. The stem, the poppet, the guide rod, the spring, and the guide plate opening can be coaxially aligned along a centerline of the passage. The poppet can be a first poppet and the valve can further comprise a second poppet directly coupled to the stem.

The pressure relief valve can be included in a two-phase immersion cooling system that also comprises: a tank defining a tank volume configured to contain one or more printed circuit boards having semiconductor die that generate heat; and coolant liquid, disposed within the tank volume, configured to immerse the one or more printed circuit boards and remove the heat from the respective semiconductor die. The valve can be coupled to one of a top portion of the tank or a side portion of the tank near the top portion. Further, the tank includes a gas space located directly above the coolant liquid.

The valve can be oriented such that the first side of the poppet is an inner side facing the tank volume and the second side is an outer side facing an ambient environment surrounding the system where the fluid applying the first pressure to the inner side of the poppet is a mixture of air and coolant vapor contained in the gas space of the tank and air in the ambient environment applies the second pressure to the outer side of the poppet. Further, the coolant vapor can have a density greater than the air and, during operation of the system, the fluid in the gas space is stratified such that a first layer consisting essentially of the coolant vapor is disposed above the coolant liquid and a second layer consisting essentially of the air is disposed above the first layer, and the valve is coupled to the side portion of the tank above the first layer such that when the poppet assembly is at the open position or between the open position and the closed position, the fluid from the second layer passes through the passage of the valve. The valve can further be directly coupled to the tank. The two-phase immersion cooling system can further comprise: an adsorbent chamber coupled to one of the top portion of the tank or the side portion of the tank near the top portion and directly coupled to the valve such that the adsorbent chamber is disposed between the valve and the tank; and one or more filters, disposed within the adsorbent chamber, to adsorb coolant vapor in the fluid when the fluid flows through the adsorbent chamber thereby reducing a concentration of coolant vapor in the fluid flowing through the valve. Additionally, the valve can be a first valve and the system can further comprise a second valve identical to the first valve directly coupled to the tank and the adsorbent chamber where the second valve is oriented such that the first side of the poppet of the second valve is an inner side facing the tank volume and the second side of the poppet of the second valve is an outer side facing the adsorbent chamber.

Alternatively, the valve can be oriented such that the first side of the poppet is an outer side facing an ambient environment surrounding the system and the second side of the poppet is an inner side facing the tank volume where the fluid applying the first pressure to the outer side of the poppet is air in the ambient environment and a mixture of air and coolant vapor contained in the gas space of the tank applies the second pressure to the inner side of the poppet. The system can further comprise: an adsorbent chamber coupled to one of the top portion of the tank or the side portion of the tank near the top portion and directly coupled to the valve such that the adsorbent chamber is disposed between the valve and the tank where the adsorbent chamber has a screen; and desiccant, disposed within the adsorbent chamber and supported by the screen, to adsorb water vapor in the fluid when the fluid flows through the adsorbent chamber thereby reducing a concentration of water vapor in the fluid flowing into the tank. The valve can be a first valve and the system can further comprise a second valve identical to the first valve directly coupled to the tank and the adsorbent chamber where the second valve is oriented such that the first side of the poppet of the second valve is an outer side facing the adsorbent chamber and the second side of the poppet of the second valve is an inner side facing the tank volume.

The two-phase cooling system can further comprise a bellows assembly, which, in turn, comprises: a container defining a container volume configured to receive a mixture of air and coolant from the gas space when a pressure within the tank volume increases and to supply the mixture to the gas space when the pressure within the tank volume decreases; and a venting tube to fluidically couple the container to the tank. The valve is directly coupled to one of a top portion of the bellows assembly, a side portion of the bellows assembly, or the venting tube between the bellows assembly and the tank.

The valve can be a first valve and the system can further comprise a second valve identical to the first valve coupled to one of the top portion of the tank or the side portion of the tank near the top portion separately from the first valve. The first valve can be oriented such that the first side of the poppet of the first valve is a first inner side facing the tank volume and the second side of the poppet of the first valve is a first outer side facing an ambient environment surrounding the system, and the second valve can be oriented such that the first side of the poppet of the second valve is a second inner side facing the tank volume and the second side of the poppet of the second valve is a second outer side facing the ambient environment. The first valve can be oriented such that the second side of the poppet of the first valve is a first inner side facing the tank volume and the first side of the poppet of the first valve is a first outer side facing an ambient environment surrounding the system, and the second valve can be oriented such that the second side of the poppet of the second valve is a second inner side facing the tank volume and the first side of the poppet of the second valve is a second outer side facing the ambient environment. The first valve can be oriented such that the first side of the poppet of the first valve is a first inner side facing the tank volume and the second side of the poppet of the first valve is a first outer side facing an ambient environment surrounding the system, and the second valve can be oriented such that the second side of the poppet of the second valve is a second inner side facing the tank volume and the first side of the poppet of the second valve is a second outer side facing the ambient environment.

In another example implementation, a pressure relief valve for a two-phase immersion cooling system comprises: a valve body defining a passage having a diameter ranging from about 2 inches to about 6 inches; a guide plate, directly coupled to the valve body, having a guide plate opening; and a poppet assembly slidably coupled to the valve body and the guide plate and movable between and including a closed position and an open position. The poppet assembly is configured to prevent a fluid from flowing through the passage at the closed position and allow the fluid to flow through the passage at the open position or between the open position and the closed position. The poppet assembly comprises: a stem slidably coupled to the valve body; a poppet, directly coupled to the stem, having a first side and a second side opposite to the first side where the poppet seals the passage to prevent the fluid from flowing through the passage at the closed position and allows the fluid to flow through the passage at the open position or between the open position and the closed position; and a guide rod directly coupled to the stem, inserted through the guide plate opening to laterally constrain the poppet with respect to the guide plate, and slidably movable with respect to the guide plate. The valve further comprises a spring, disposed between the valve body and the poppet assembly, to apply a spring force to the poppet assembly such that the poppet assembly remains at the closed position and only moves from the closed position towards the open position when the fluid applies a first pressure to the first side of the poppet greater than a second pressure applied to the second side of the poppet and a pressure difference between the first pressure and the second pressure is greater than or equal to a pressure threshold corresponding to the spring force.

The valve can be included in a two-phase immersion cooling system that also comprises: a tank defining a tank volume configured to contain one or more printed circuit boards having semiconductor die that generate heat; and coolant liquid, disposed within the tank volume, configured to immerse the one or more printed circuit boards and remove the heat from the respective semiconductor die. The valve is coupled to the tank. The system can further comprise an adsorbent chamber coupled to one of the top portion of the tank or the side portion of the tank near the top portion and directly coupled to the valve such that the adsorbent chamber is disposed between the valve and the tank. The valve can be oriented such that the first side of the poppet is an inner side facing the tank volume and the second side is an outer side facing an ambient environment surrounding the system where the fluid applying the first pressure to the inner side of the poppet can be a mixture of air and coolant vapor contained in the gas space of the tank and air in the ambient environment applies the second pressure to the outer side of the poppet, and the adsorbent chamber contains one or more filters to adsorb coolant vapor in the fluid when the fluid flows through the adsorbent chamber thereby reducing a concentration of coolant vapor in the fluid flowing through the valve. The valve can oriented such that the first side of the poppet is an outer side facing an ambient environment surrounding the system and the second side of the poppet is an inner side facing the tank volume where the fluid applying the first pressure to the outer side of the poppet is air in the ambient environment and a mixture of air and coolant vapor contained in the gas space of the tank applies the second pressure to the inner side of the poppet, and the adsorbent chamber contains desiccant to adsorb water vapor in the fluid when the fluid flows through the adsorbent chamber thereby reducing a concentration of water vapor in the fluid flowing into the tank.

In another example implementation, a pressure relief valve for a two-phase immersion cooling system comprises: a valve body defining a passage; and a poppet assembly slidably coupled to the valve body and movable between and including a closed position and an open position. The poppet assembly is configured to prevent a fluid from flowing through the passage at the closed position and allow the fluid to flow through the passage at the open position or between the open position and the closed position. The poppet assembly comprises: a stem slidably coupled to the valve body; and a poppet, directly coupled to the stem, having a first side and a second side opposite to the first side where the poppet seals the passage to prevent the fluid from flowing through the passage at the closed position and allows the fluid to flow through the passage at the open position or between the open position and the closed position. The valve further comprises a spring, disposed between the valve body and the poppet assembly, to apply a spring force to the poppet assembly such that the poppet assembly remains at the closed position and only moves from the closed position towards the open position when the fluid applies a first pressure to the first side of the poppet greater than a second pressure applied to the second side of the poppet and a pressure difference between the first pressure and the second pressure is greater than or equal to a pressure threshold corresponding to the spring force. The pressure threshold ranges from about 0.5 pounds per square inch (psi) to about 2 psi and when the poppet assembly is at the open position or between the open position and the closed position, the valve is configured to allow the fluid to flow through the passage at a rate up to about 600 cfm.

In another example implementation, a two-phase immersion cooling system comprises: a tank defining a tank volume configured to contain one or more printed circuit boards having semiconductor die that generate heat; coolant liquid, disposed within the tank volume, configured to immerse the one or more printed circuit boards and remove the heat from the respective semiconductor die via vaporization thereby producing coolant vapor; and a valve assembly coupled to the tank. The valve assembly comprises a pressure relief valve comprising: a valve body defining a passage; a guide plate, directly coupled to the valve body, having a guide plate opening; and a poppet assembly slidably coupled to the valve body and the guide plate and movable between and including a closed position and an open position where the poppet assembly is configured to prevent a fluid from flowing through the passage at the closed position and allow the fluid to flow through the passage at the open position or between the open position and the closed position. The poppet assembly comprises: a stem slidably coupled to the valve body; a poppet, directly coupled to the stem, having a first side and a second side opposite to the first side where the poppet seals the passage to prevent the fluid from flowing through the passage at the closed position and allows the fluid to flow through the passage at the open position or between the open position and the closed position; and a guide rod directly coupled to the stem, inserted through the guide plate opening to laterally constrain the poppet with respect to the guide plate, and slidably movable with respect to the guide plate. The valve further comprises a spring, disposed between the valve body and the poppet assembly, to apply a spring force to the poppet assembly such that the poppet assembly remains at the closed position and only moves from the closed position towards the open position when the fluid applies a first pressure to the first side of the poppet greater than a second pressure applied to the second side of the poppet and a pressure difference between the first pressure and the second pressure is greater than or equal to a pressure threshold corresponding to the spring force.

In another example implementation, a two-phase immersion cooling system comprises: a tank defining a tank volume configured to contain one or more printed circuit boards having semiconductor die that generate heat; coolant liquid, disposed within the tank volume, configured to immerse the one or more printed circuit boards and remove the heat from the respective semiconductor die via vaporization thereby producing coolant vapor; and an inlet valve assembly coupled to the tank. The inlet valve assembly comprises: a pressure relief valve having an open position and a closed position, the valve being configured to remain in the closed position and only move from the closed position towards the open position when A) a first pressure applied to an outer side of the valve by a first mixture of air and water vapor in an ambient environment surrounding the system is greater than a second pressure applied to an inner side of the valve by a second mixture of air and the coolant vapor and B) a pressure difference between the first pressure and the second pressure is greater than a pressure threshold of the valve; and an adsorbent chamber, disposed between the pressure relief valve and the tank, containing desiccant to adsorb the water vapor in the first mixture as the first mixture flows through the adsorbent chamber thereby reducing a concentration of the water vapor in the first mixture flowing through the valve.

The pressure threshold of the valve can range from about 0.5 pounds per square inch (psi) to about 2 psi, and, when the valve is at the open position or between the open position and the closed position, the valve can be configured to allow the fluid to flow through the valve at a rate ranging from about 0 cubic feet per minute (cfm) to about 2000 cfm. The passage of the valve can have a diameter ranging from about 2 inches to about 6 inches, and the spring can have a diameter ranging from about 1.5 inches to about 1.7 inches. The valve assembly can be directly coupled to the tank. The tank volume can include a gas space to contain a mixture of air and the coolant vapor and the system can further comprise a bellows assembly comprising: a container defining a container volume configured to receive the mixture from the gas space when a pressure within the tank volume increases and to supply the mixture to the gas space when the pressure within the tank volume decreases; and a venting tube to fluidically couple the container to the tank, where the valve assembly is directly coupled to the bellows assembly. The valve assembly can be an inlet valve assembly where the fluid is a first mixture of air and water vapor in an ambient environment surrounding the system, the first mixture applies the first pressure to the first side of the poppet. and a second mixture of air and the coolant vapor applies the second pressure to the second side of the poppet. The inlet valve assembly can further comprise an adsorbent chamber, disposed between the valve and the tank, containing desiccant to adsorb the water vapor in the first mixture as the first mixture flows through the adsorbent chamber thereby reducing a concentration of the water vapor in the first mixture flowing through the valve. The valve assembly can be an outlet valve assembly where the fluid is a first mixture of air and the coolant vapor, the first mixture applies the first pressure to the first side of the poppet, and a second mixture air and water vapor in an ambient environment surrounding the system applies the second pressure to the second side of the poppet. The outlet valve assembly can further comprise an adsorbent chamber, disposed between the valve and the tank, containing one or more filters to adsorb the coolant vapor in the first mixture as the first mixture flows through the adsorbent chamber thereby reducing a concentration of the coolant vapor in the first mixture flowing through the valve.

In another example implementation, a two-phase immersion cooling system, comprises: a tank defining a tank volume configured to contain one or more printed circuit boards having semiconductor die that generate heat; coolant liquid, disposed within the tank volume, configured to immerse the one or more printed circuit boards and remove the heat from the respective semiconductor die via vaporization thereby producing coolant vapor; and an inlet valve assembly coupled to the tank. The inlet valve assembly comprises: a pressure relief valve having an open position and a closed position, the valve being configured to remain in the closed position and only move from the closed position towards the open position when A) a first pressure applied to an outer side of the valve by a first mixture of air and water vapor in an ambient environment surrounding the system is greater than a second pressure applied to an inner side of the valve by a second mixture of air and the coolant vapor and B) a pressure difference between the first pressure and the second pressure is greater than a pressure threshold of the valve; and an adsorbent chamber, disposed between the pressure relief valve and the tank, containing desiccant to adsorb the water vapor in the first mixture as the first mixture flows through the adsorbent chamber thereby reducing a concentration of the water vapor in the first mixture flowing through the valve.

The valve can be a first valve, and the inlet valve assembly can further comprise a second pressure relief valve identical to the first valve and directly coupled to the tank and the adsorbent chamber, the second valve being oriented such that the outer side of the second valve faces the adsorbent chamber and the inner side of the second valve faces the tank volume. The pressure relief valve can be removably coupled to the adsorbent chamber by a first coupling mechanism and the adsorbent chamber can be removably coupled to the tank by a second coupling mechanism. Each of the first and second coupling mechanisms can comprise at least one of a latch, a screw fastener, or a bolt fastener. The adsorbent chamber can comprise at least one sight glass to facilitate visual inspection of the desiccant. The valve can be a first valve, the pressure threshold can be a first pressure threshold, and the system can further comprise: an outlet valve assembly coupled to the tank, the outlet valve assembly comprising a second pressure relief valve having an open position and a closed position where the pressure relief valve is configured to remain in the closed position and only move from the closed position towards the open position when A) a third pressure applied by to an inner side of the second valve by the second mixture is greater than a fourth pressure applied to an outer side of the second valve by the first mixture and B) a pressure difference between the third pressure and the fourth pressure is greater than a second pressure threshold of the second valve. The first pressure threshold and the second pressure threshold can be different. At least one of the first valve or the second valve can comprise: a valve body defining a passage having a diameter ranging from about 2 inches to about 6 inches; a guide plate, directly coupled to the valve body, having a guide plate opening; and a poppet assembly slidably coupled to the valve body and the guide plate. The poppet assembly can comprise: a stem slidably coupled to the valve body; a poppet directly coupled to the stem; and a guide rod directly coupled to the stem, inserted through the guide plate opening to laterally constrain the poppet with respect to the guide plate, and slidably movable with respect to the guide plate. The at least one of the first valve or the second valve can further comprise a spring, disposed between the valve body and the poppet assembly, to apply a spring force to the poppet assembly. The first valve can be identical to the second valve.

In another example implementation, a two-phase immersion cooling system comprises: a tank defining a tank volume configured to contain one or more printed circuit boards having semiconductor die that generate heat; coolant liquid, disposed within the tank volume, configured to immerse the one or more printed circuit boards and remove the heat from the respective semiconductor die via vaporization thereby producing coolant vapor; and an outlet valve assembly coupled to the tank. The outlet valve assembly comprises: a pressure relief valve having an open position and a closed position, the valve being configured to remain in the closed position and only move from the closed position towards the open position when A) a first pressure applied to an inner side of the valve by a first mixture of air and the coolant vapor is greater than a second pressure applied to an outer side of the valve by a second mixture of air and water vapor in an ambient environment surrounding the system and B) a pressure difference between the first pressure and the second pressure is greater than a pressure threshold of the valve, where the pressure threshold of the valve ranges from about 0.5 pounds per square inch (psi) to about 2 psi and when the valve is at the open position or between the open position and the closed position, the valve is configured to allow the first mixture to flow through the valve at a rate ranging from about 0 cubic feet per minute (cfm) to about 2000 cfm.

In another example implementation, a two-phase immersion cooling system comprises: a tank defining a tank volume configured to contain one or more printed circuit boards having semiconductor die that generate heat; coolant liquid, disposed within the tank volume, configured to immerse the one or more printed circuit boards and remove the heat from the respective semiconductor die via vaporization thereby producing coolant vapor, the tank volume including a gas space to contain a mixture of air and the coolant vapor; a bellows assembly; an inlet valve assembly directly coupled to the bellows assembly; and an outlet valve assembly directly coupled to the bellows assembly. The bellows assembly comprises: a container defining a container volume configured to receive the mixture from the gas space when a pressure within the tank volume increases and to supply the mixture to the gas space when the pressure within the tank volume decreases; and a venting tube to fluidically couple the container to the tank. The inlet valve assembly comprises a first pressure relief valve having an open position and a closed position, the first valve being configured to remain in the closed position and only move from the closed position towards the open position when A) a first pressure applied to an outer side of the first valve by a first mixture of air and water vapor in an ambient environment surrounding the system is greater than a second pressure applied to an inner side of the first valve by a second mixture of air and the coolant vapor and B) a pressure difference between the first pressure and the second pressure is greater than a pressure threshold of the first valve. The outlet valve assembly comprises a second pressure relief valve having an open position and a closed position, the second valve being configured to remain in the closed position and only move from the closed position towards the open position when A) a third pressure applied to an inner side of the second valve by the second mixture is greater than a fourth pressure applied to an outer side of the second valve by the first mixture and B) a pressure difference between the third pressure and the fourth pressure is greater than a pressure threshold of the second valve.

In another example implementation, a two-phase immersion cooling system comprises: a tank defining a tank volume; an outlet valve assembly coupled to the tank; one or more printed circuit boards, disposed in the tank volume, having semiconductor die; and coolant liquid, disposed in the tank volume, to immerse the one or more printed circuit boards. A method for operating the two-phase immersion cooling system comprises: A) operating the respective semiconductor die of the one or more printed circuit boards at a peak power density ranging from about 250 kilowatts (kW) to about 1000 kW; B) removing, via the coolant liquid, heat generated by the respective semiconductor die of the one or more printed circuit boards thereby causing generation of coolant vapor that rises into a gas space above the coolant liquid; C) in response to the coolant vapor increasing a pressure in the gas space such that a pressure difference across the outlet valve assembly is equal to or greater than a pressure threshold associated with the outlet valve assembly, opening the outlet valve assembly to flow air out of the gas space at a flow rate ranging from about 50 cubic feet per minute (cfm) to about 600 cfm; and D) in response to the pressure in the gas space decreasing such that the pressure difference is less than the pressure threshold, closing the outlet valve assembly to prevent the air within the gas space from flowing out of the gas space.

The two-phase immersion cooling system can further comprise an inlet valve assembly coupled to the tank where the inlet valve assembly comprises a valve and an adsorbent chamber filled with desiccant. Assuming the pressure difference is a first pressure difference and the pressure threshold is a first pressure threshold, the method can further comprise: E) in response to the pressure in the gas space decreasing such that a second pressure difference across the inlet valve assembly is greater equal to or greater than a second pressure threshold associated with the inlet valve assembly, opening the inlet valve assembly to flow air from an ambient environment surrounding the two-phase immersion cooling system into the gas space, the air from the ambient environment flowing through the desiccant in the adsorbent chamber to reduce a concentration of water vapor in the air from the ambient environment; and F) in response to the pressure in the gas space increasing such that the second pressure difference is less than the second pressure threshold, closing the inlet valve assembly to prevent the air from the ambient environment flowing into the gas space.

The valve in the outlet valve assembly and/or the inlet valve assembly can comprise: a valve body defining a passage; a guide plate, directly coupled to the valve body, having a guide plate opening; and a poppet assembly slidably coupled to the valve body and the guide plate and movable between and including a closed position and an open position. The poppet assembly is configured to prevent the air within the gas space from flowing through the passage at the closed position and allow the air within the gas space to flow through the passage at the open position or between the open position and the closed position. The poppet assembly comprises: a stem slidably coupled to the valve body; a poppet, directly coupled to the stem, having a first side and a second side opposite to the first side where the poppet seals the passage to prevent the air within the gas space from flowing through the passage at the closed position and allows the air within the gas space to flow through the passage at the open position or between the open position and the closed position; and a guide rod directly coupled to the stem, inserted through the guide plate opening to laterally constrain the poppet with respect to the guide plate, and slidably movable with respect to the guide plate. The valve can further comprise a spring, disposed between the valve body and the poppet assembly, to apply a spring force to the poppet assembly such that the poppet assembly remains at the closed position and only moves from the closed position to the open position when the pressure difference across the poppet is greater than or equal to a pressure threshold associated with that valve.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

DETAILED DESCRIPTION

Figure 1A:
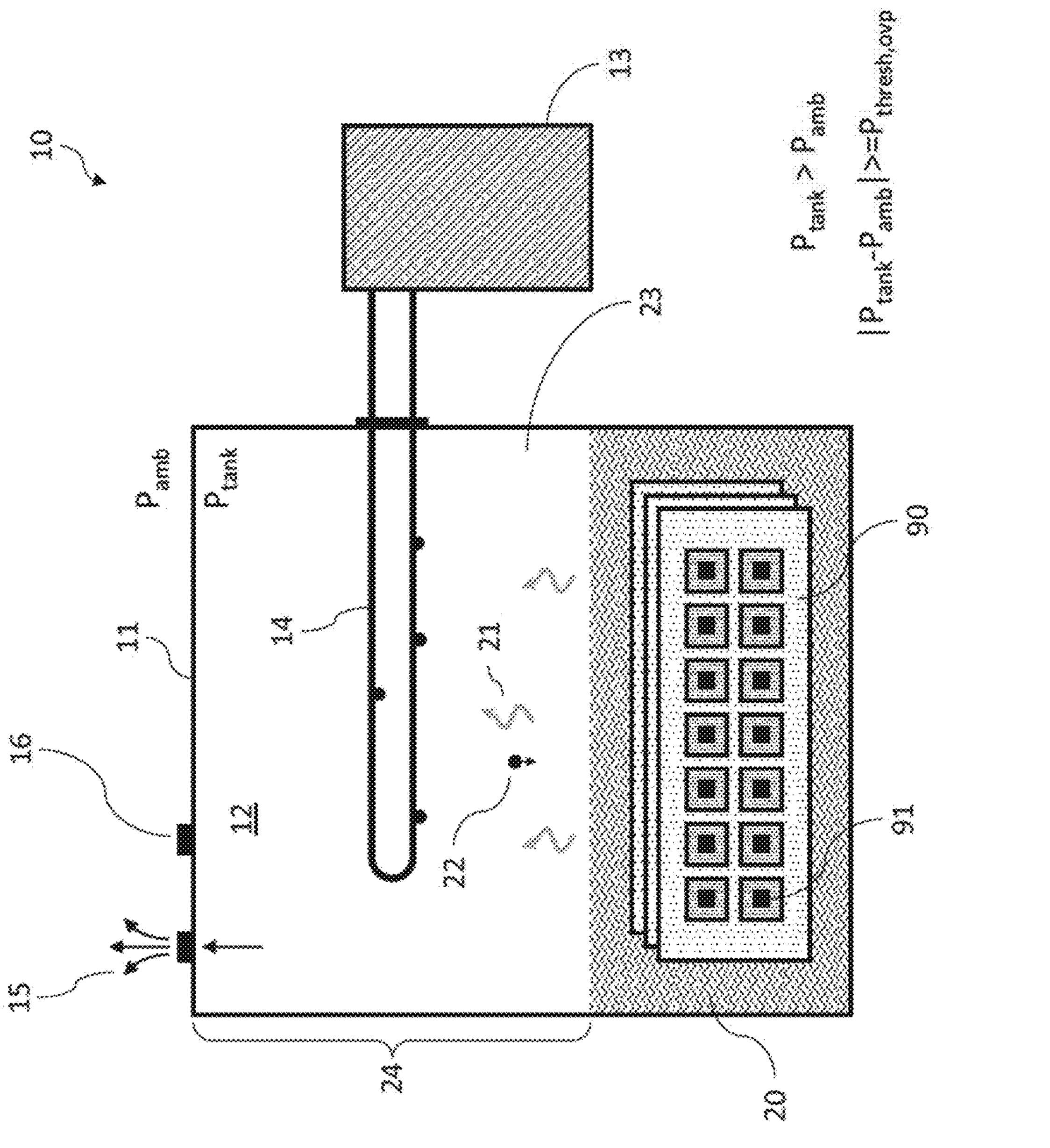
FIG. 1A shows a representative two-phase immersion cooling system in an overpressure condition.
Figure 1B:
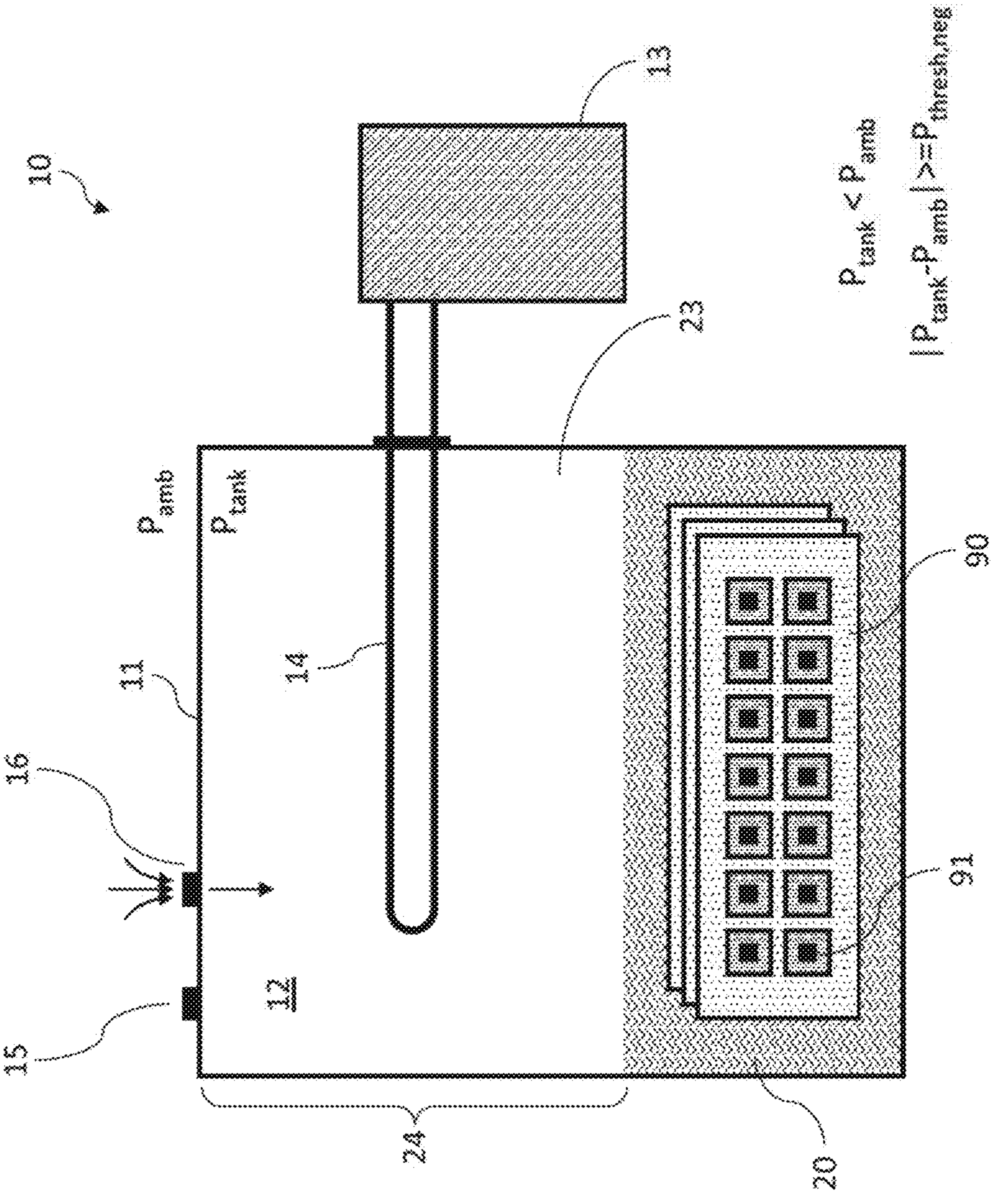
FIG. 1B shows the two-phase immersion cooling system of FIG. 1A in a negative pressure condition.

Following below are more detailed descriptions of various concepts related to, and implementations of, a pressure relief valve that supports relatively high flow rates of fluid when open. The present disclosure is also directed to various example implementations of outlet valve assemblies, inlet valve assemblies, and/or two-phase immersion cooling systems that incorporate the pressure relief valve. In particular, some example outlet valve assemblies and inlet valve assemblies disclosed herein include an adsorbent chamber, for example to reduce a concentration of coolant vapor from the air flowing out to an ambient environment when the valve is open under overpressure conditions or to reduce a concentration of water vapor in the air flowing into the cooling system from the ambient environment when the valve is open under negative pressure conditions. The present disclosure is also directed to various methods of using the pressure relief valve, the outlet valve assembly, the inlet valve assembly, and/or the two-phase immersion cooling system. It should be appreciated that various concepts introduced above and discussed in greater detail below may be implemented in multiple ways. Examples of specific implementations and applications are provided primarily for illustrative purposes so as to enable those skilled in the art to practice the implementations and alternatives apparent to those skilled in the art.

The figures and example implementations described below are not meant to limit the scope of the present implementations to a single embodiment. Other implementations are possible by way of interchange of some or all of the described or illustrated elements. Moreover, where certain elements of the disclosed example implementations may be partially or fully implemented using known components, in some instances only those portions of such known components that are necessary for an understanding of the present implementations are described, and detailed descriptions of other portions of such known components are omitted so as not to obscure the present implementations.

In the discussion below, various examples of a pressure relief valve, an outlet valve assembly, an inlet valve assembly, and a two-phase immersion cooling system are provided, wherein a given example or set of examples showcases one or more features of a spring, a guide plate, a guide rode, a gasket, a valve chamber, an adsorbent chamber, and a venting tube. It should be appreciated that one or more features discussed in connection with a given example of a pressure relief valve, an outlet valve assembly, an inlet valve assembly, or a two-phase immersion cooling system may be employed in other examples of pressure relief valves, outlet valve assemblies, inlet valve assemblies, and two-phase immersion cooling systems according to the present disclosure, such that the various features disclosed herein may be readily combined in a given pressure relief valve, outlet valve assembly, inlet valve assembly, or two-phase immersion cooling system according to the present disclosure (provided that respective features are not mutually inconsistent).

Certain dimensions and features of the pressure relief valve, the outlet valve assembly, the inlet valve assembly, and the two-phase immersion cooling system are described herein using the terms “approximately,” “about,” “substantially,” and/or “similar.” As used herein, the terms “approximately,” “about,” “substantially,” and/or “similar” indicates that each of the described dimensions or features is not a strict boundary or parameter and does not exclude functionally similar variations therefrom. Unless context or the description indicates otherwise, the use of the terms “approximately,” “about,” “substantially,” and/or “similar” in connection with a numerical parameter indicates that the numerical parameter includes variations that, using mathematical and industrial principles accepted in the art (e.g., rounding, measurement or other systematic errors, manufacturing tolerances, etc.), would not vary the least significant digit.

1. An Example Pressure Relief Valve with One Poppet

Figure 2A:
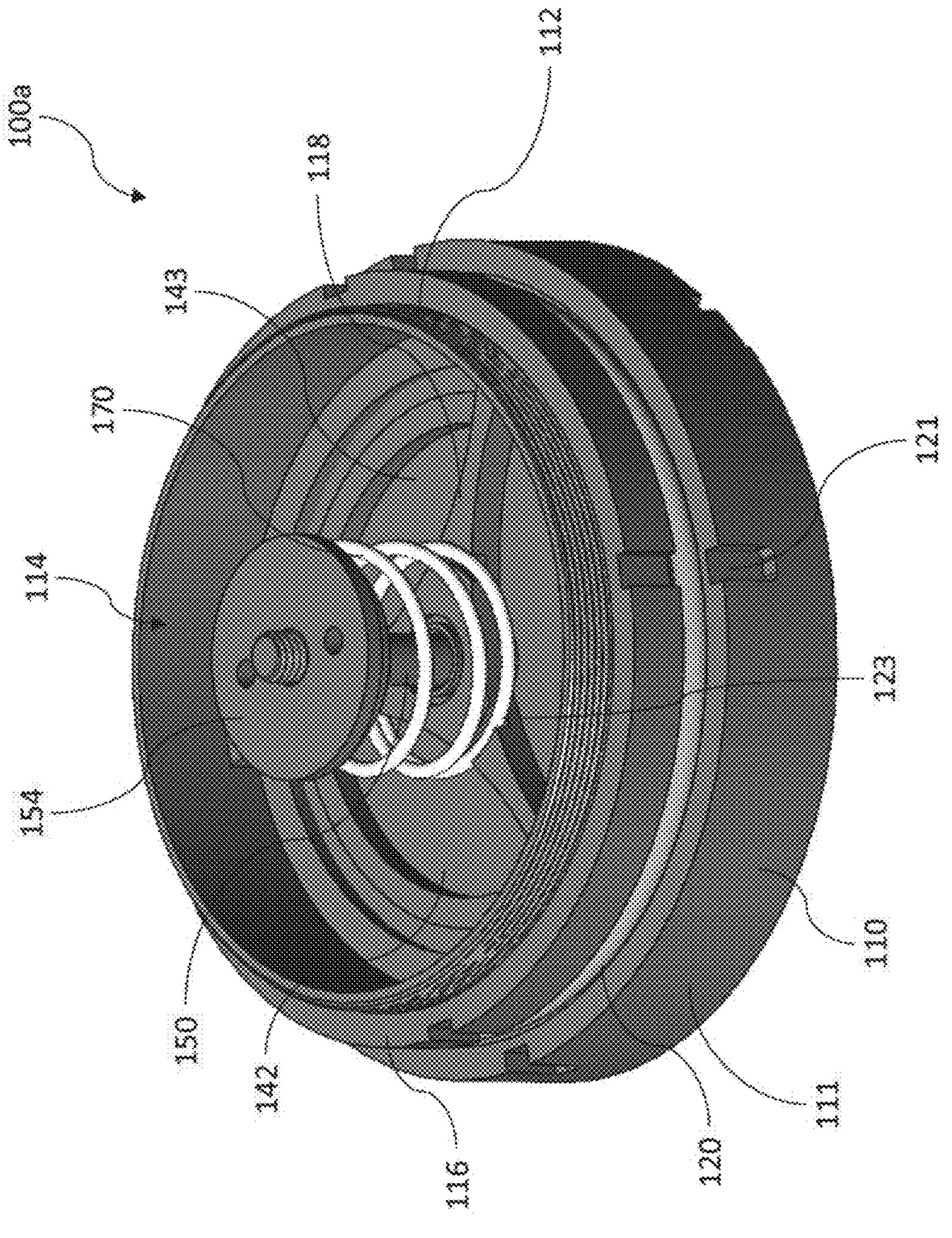
FIG. 2A shows a bottom perspective view of an example pressure relief valve with one poppet where the poppet is at a closed position.
Figure 2B:
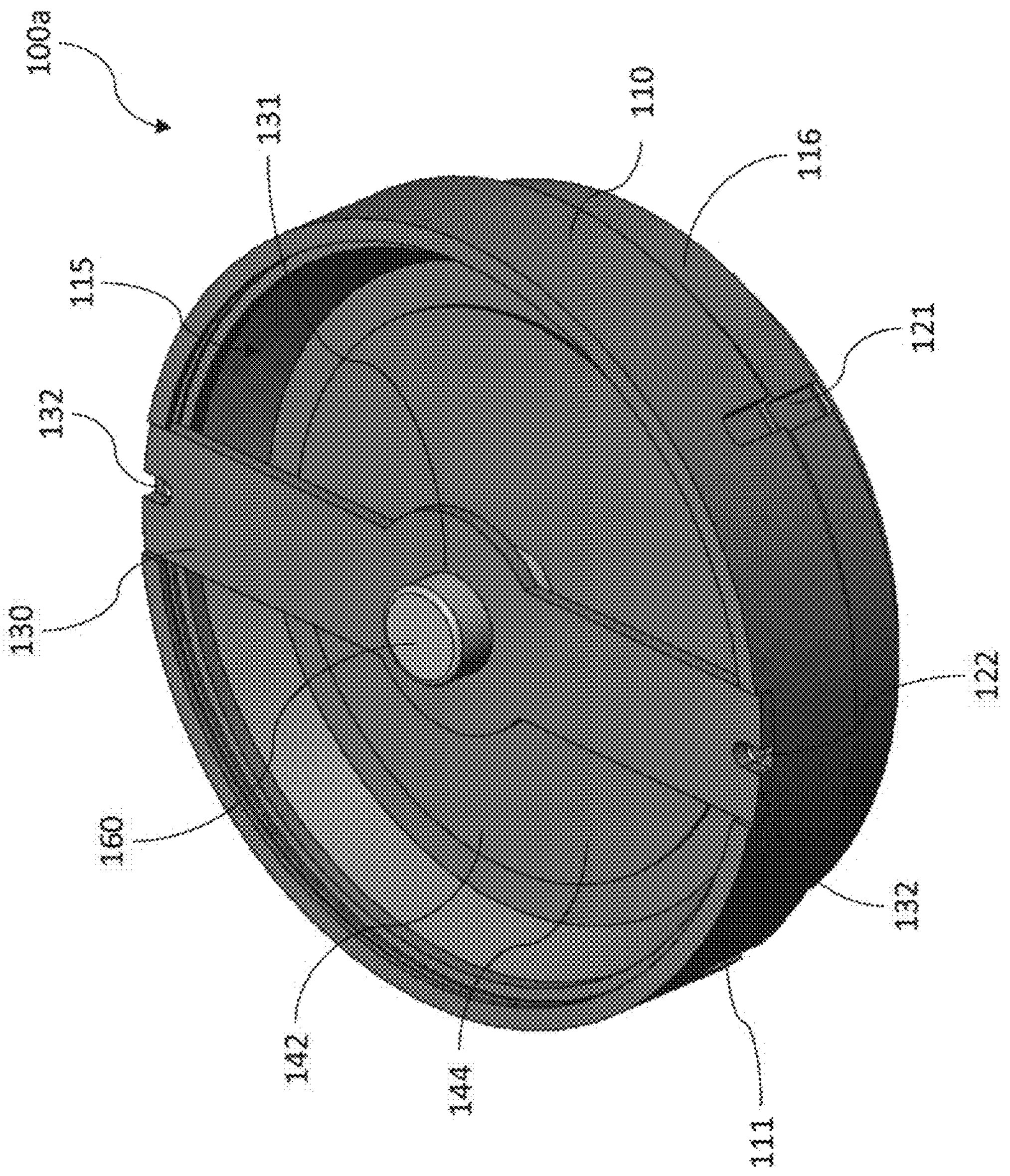
FIG. 2B shows a top perspective view of the pressure relief valve of FIG. 2A.
Figure 2C:
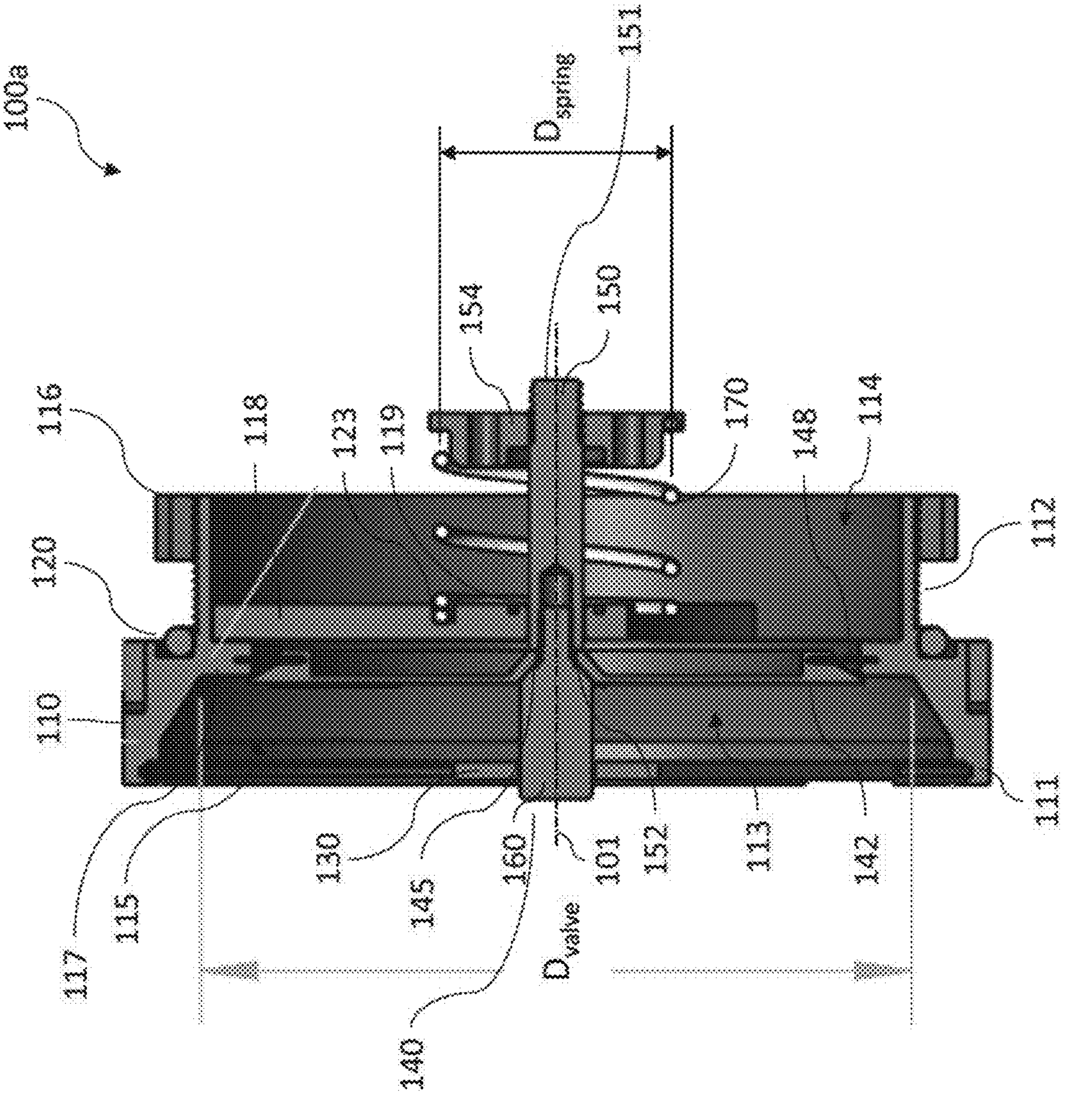
FIG. 2C shows a cross-sectional side view of the pressure relief valve of FIG. 2A.

FIGS. 2A-2C show an example pressure relief valve 100*a* (hereafter also referred to as a "valve 100*a*") with a single poppet 142 where the valve 100*a* is configured to support a flow of fluid at relatively high flow rates when the valve 100*a* is open. The valve 100*a* may be a one-way valve 100*a*. In other words, the valve 100*a* may only open when (a) a first pressure on a first side 143 of a poppet 142 in the valve 100*a* is greater than a second pressure on a second side 144 of the poppet 142 opposite the first side 143 and (b) the difference between the first and second pressures exceeds a predetermined pressure threshold. If the second pressure is greater than the first pressure or the pressure difference is less than the pressure threshold, the valve 100*a* remains closed and sealed, thus preventing any fluid from flowing through the valve 100*a*.

As shown, the valve 100*a* includes a valve body 110, which provides mechanical support for the poppet 142 and other components of the valve 100*a*. The valve body 110 includes a flange section 111 and a threaded section 112 that together form a passage 113 with a first opening 114 defined by the threaded section 112 and a second opening 115 opposite to the first opening 114 defined by the flange section 111. A fluid may pass through the passage 113 when the valve 100*a* is open.

The flange section 111 and the threaded section 112 may facilitate installation of the valve 100*a* (e.g., onto a tank of a two-phase immersion cooling system). For example, when the valve 100*a* is installed onto a wall of a tank, the threaded section 112 may be inserted through an opening formed on the wall until the flange section 111 or, more preferably, an O-ring 120 disposed around and supported by the flange section 111 physically contacts a first side of the wall. A mounting ring 116 may be fastened onto threads formed along an exterior of the threaded section 112 from within the tank volume on a second side of the wall. The mounting ring 116 may then be tightened to clamp the wall between the flange section 111 or O-ring 120 and the mounting ring 116, thus securely coupling the valve 100*a* to the wall of the tank. In some implementations, the flange section 111 and/or the threaded section 112 may further include one or more spanner features 121 along the exterior to couple other components to the valve 100*a* (see, for example, the dust cap 450 in FIG. 11).

The valve body 110 may include a ledge 117 and a support bridge 118 disposed within the passage 113. The ledge 117 may form a seal with the poppet 142 when the valve 100*a* is closed. The support bridge 118 is used to support a poppet assembly 140 that includes the poppet 142, which is described in further detail below. A guide plate 130 may further be mounted to the valve body 110 and disposed on or near the second opening 115 of the valve body 110. In some implementations, the guide plate 130 may be fastened to the valve body 110. For example, the guide plate 130 may include one or more notches 132 that align with corresponding fastener openings 122 on the flange section 111, as shown in FIG. 2B.

Figure 3A:
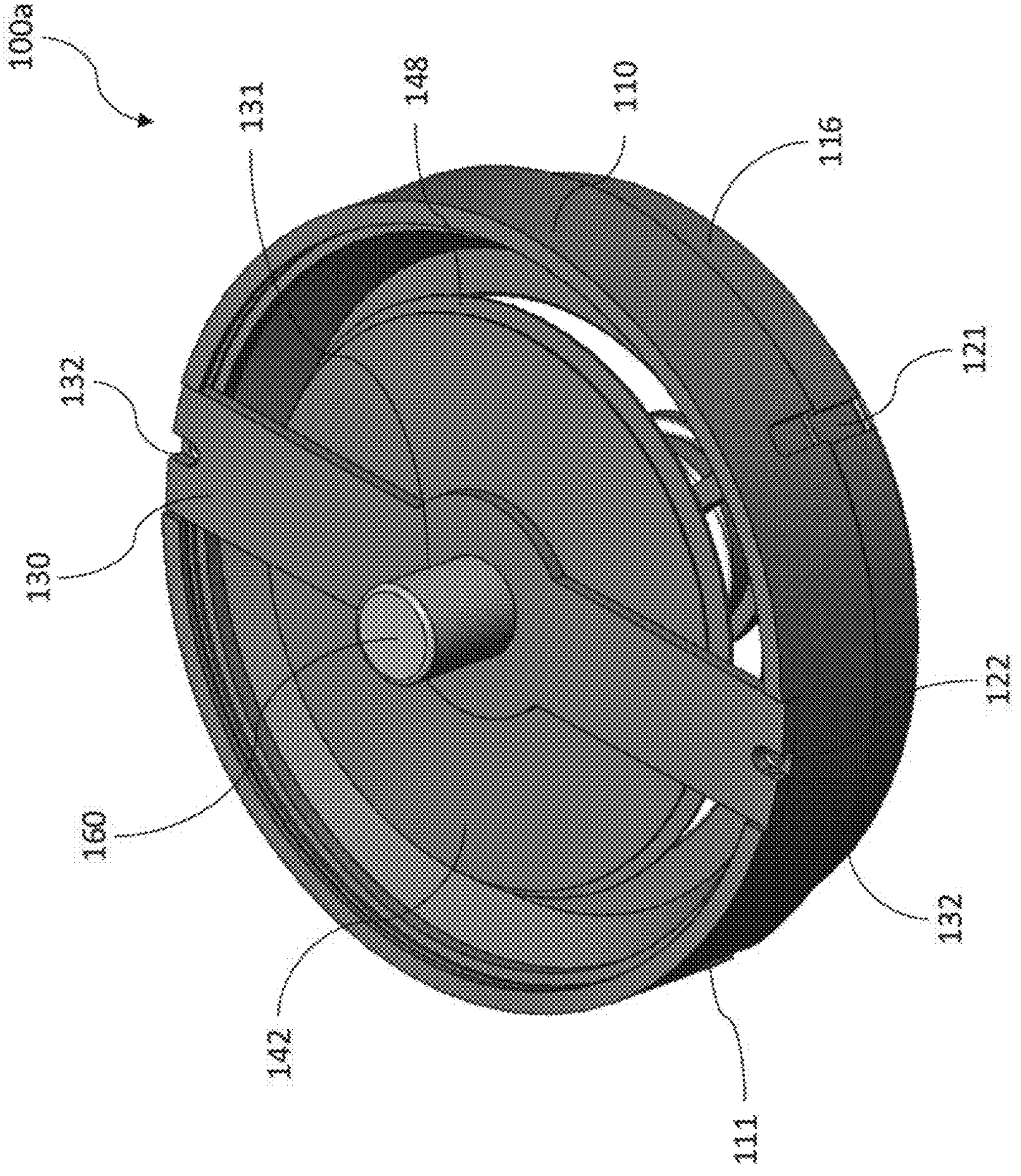
FIG. 3A shows a top perspective view of the pressure relief valve of FIG. 2A where the poppet is at an open position.
Figure 3C:
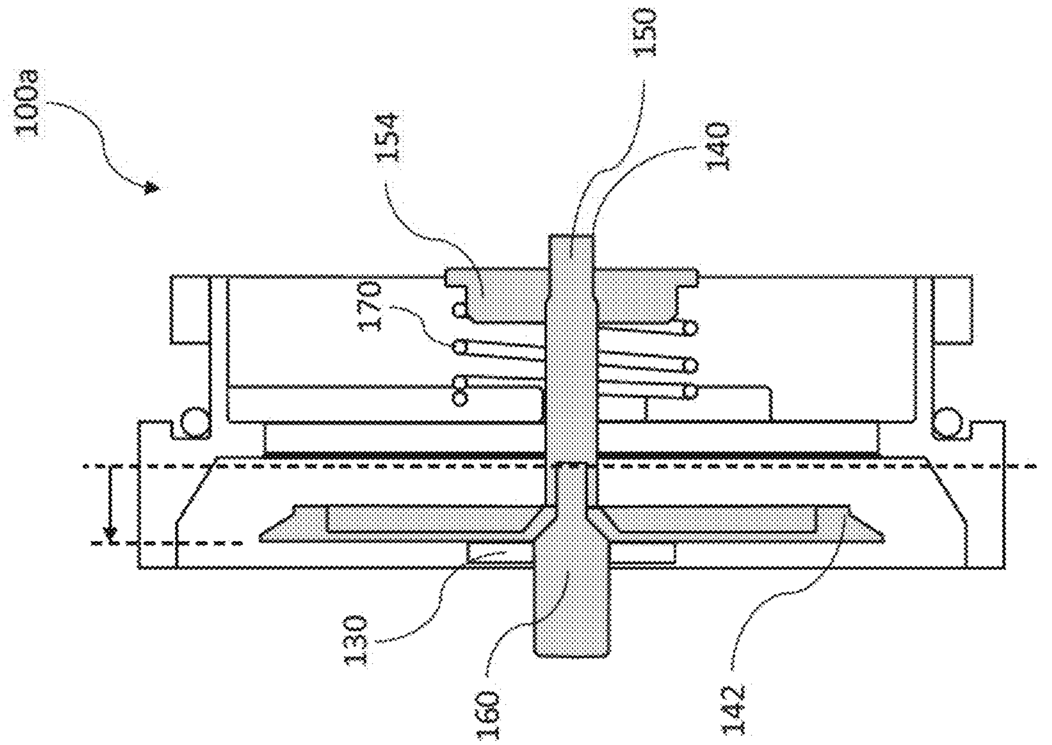
FIG. 3C shows a cross-sectional side view of the pressure relief valve of FIG. 2A where the poppet is at the open position.
Figure 3B:
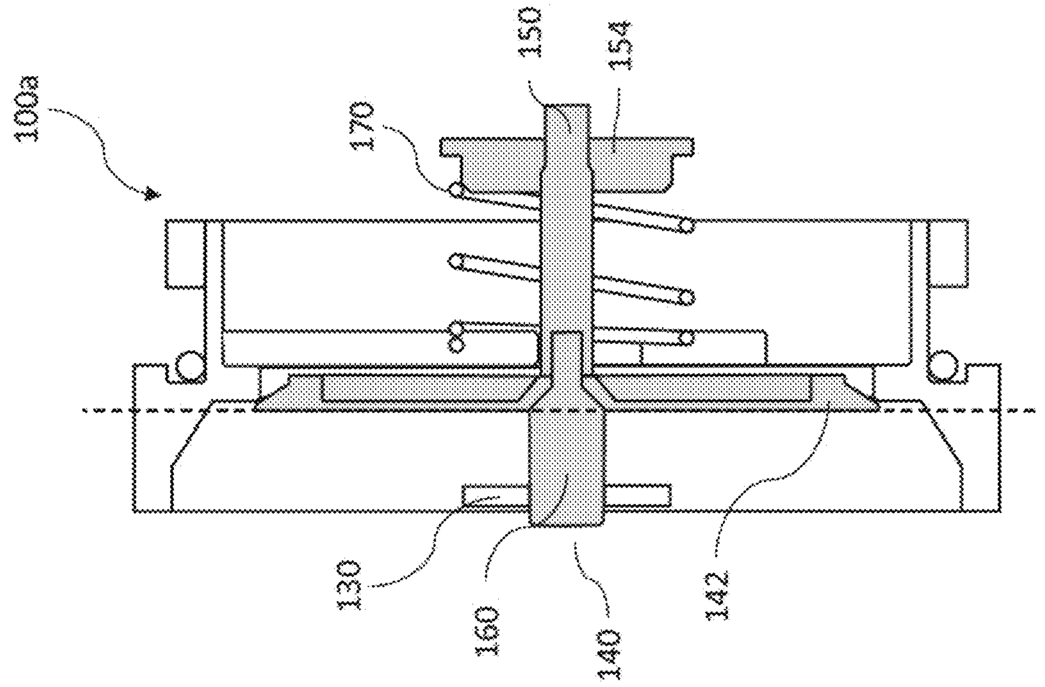
FIG. 3B shows a cross-sectional side view of the pressure relief valve of FIG. 2A where the poppet is at the closed position.

The valve 100*a* further includes the poppet assembly 140, which is slidably movable with respect to the valve body 110 and the guide plate 130 between and including an open position and a closed position. In the closed position, the poppet 142 in the poppet assembly 140 forms a seal with the ledge 117 of the valve body 110, thus preventing fluid from flowing through the passage 113 (see FIG. 3B). In the open position, the poppet assembly 140 is moved such that the poppet 142 is offset from the ledge 117 (i.e., the poppet 142 does not physically contact the ledge 117), thus forming a gap that allows fluid to flow through the passage 113 (see FIGS. 3A and 3C).

The poppet assembly 140 may include a stem 150 inserted through and slidably coupled to a support bridge opening 119 formed by the support bridge 118. The poppet assembly 140 may further include a spring retainer 154 directly coupled to a first end 151 of the stem 150 and a guide rod 160 directly coupled to a second end 152 of the stem 150 opposite to the first end 151. In some implementations, the stem 150 may include threaded sections at the first end 151 and the second end 142, and the spring retainer 154 and the guide rod 160 may be fastened to these respective threaded sections. The guide rod 160 may be inserted through an opening 145 formed on the poppet 142 to securely couple the poppet 142 to the stem 150 when the guide rod 160 is coupled to the stem 150, as shown in FIG. 2C. The guide rod 160 may be further inserted through and slidably coupled to a guide plate opening 131 formed by the guide plate 130. In some implementations, the guide rod 160 (and by extension the guide plate opening 131), the poppet 142, the stem 150 (and by extension the support bridge 118 opening), the spring 170, and the spring retainer 154 may be coaxially aligned along a centerline 101 of the passage 113.

A spring 170 may be disposed between the support bridge 118 and the spring retainer 154. The spring 170 may apply a spring force onto the spring retainer 154 and, by extension the poppet assembly 140. The spring force may be configured to maintain the poppet assembly 140 at the closed position. Thus, the poppet assembly 140 may only move from the closed position if an external force is applied to the valve 100*a* in opposition to the spring force with a magnitude greater than the magnitude of the spring force.

In this manner, the properties of the spring 170 may determine the pressure threshold at which the poppet assembly 140 begins to move from the closed position, which, in turn, determines when fluid may flow through the passage 113 of the valve 100*a*. For example, a first fluid may apply a first pressure to the first side 143 of the poppet 142 and a second fluid may apply a second pressure to the second side 144 of the poppet 142. When the pressure difference between the first and second pressures yields a net force directed in opposition to the spring force applied to the poppet assembly 140 (i.e., the first pressure is greater than the second pressure) and the magnitude of the net force is greater than the magnitude of the spring force, the poppet assembly 140 may move from the closed position towards the open position. Otherwise, if the second pressure is greater than the first pressure and/or the pressure difference yields a net force with a magnitude less than the magnitude of the spring force, the poppet assembly 140 may remain at the closed position.

In some implementations, the poppet 142 may further support a gasket 148 disposed along its periphery such that the gasket 148 is disposed between the poppet 142 and the ledge 117 of the valve body 110. The gasket 148 may facilitate formation of a better seal between the poppet 142 and the ledge 117 when the poppet assembly 140 is at the closed position. In some implementations, the gasket 148 may be formed of a material that is not reactive and/or otherwise chemically stable in the presence of air, coolant vapor, and/or water vapor. For example, the gasket may be formed from various rubbers that are chemically inert with various fluorocarbon-based coolants, such as fluoroketone, including, but not limited to, butyl rubber, ethylene propylene diene monomer (EPDM) rubber, nitrile butadiene rubber (NBR), and any combinations of the foregoing.

The pressure threshold to open the valve 100*a* may be relatively low, ranging from about 0.5 pounds per square inch (psi) to about 2 psi, including all values and sub-ranges in between. The term "about," when used to describe the pressure threshold is intended to cover manufacturing tolerances of the respective components in the valve 100*a*, which affect the pressure threshold (e.g., the spring), as described in further detail below. For example, "about 1 psi" may correspond to the following ranges: 0.99 to 1.01 psi (+/−1% variation), 0.98 to 1.02 psi (+/−2% variation), 0.97 to 1.03 psi (+/−3% variation), 0.96 to 1.04 psi (+/−4% variation), 0.95 to 1.05 psi (+/−5% variation), including all values and sub-ranges in between.

The valve 100*a* may be configured to support flow rates of fluid ranging from about 0 cfm to about 2000 cfm, including all values and sub-ranges in between. For example, the valve 100*a* may support the following non-limiting sub-ranges of flow rates: from about 0 cfm to about 500 cfm; from about 0 cfm to about 550 cfm; from about 0 cfm to about 600 cfm; from about 50 cfm to about 500 cfm; from about 50 cfm to about 550 cfm; from about 50 cfm to about 600 cfm; from about 50 cfm to about 2000 cfm; from about 75 cfm to about 500 cfm; from about 75 cfm to about 550 cfm; from about 75 cfm to about 600 cfm; from about 75 cfm to about 2000 cfm; from about 400 cfm to about 500 cfm; from about 400 cfm to about 550 cfm; from about 400 cfm to about 600 cfm; or from about 400 cfm to about 2000 cfm. The term "about," when used to describe the flow rate of fluid through the valve 100*a*, is intended to cover fluctuations in the flow rate that occur during operation due, for example, to fluctuations in the generation of coolant vapor (e.g., due to fluctuations in the load of the computing system). For example, "about 500 cfm" may correspond to the following ranges: 495 to 505 cfm (+/−1% variation), 490 to 510 cfm (+/−2% variation), 485 to 515 cfm (+/−3% variation), 480 to 520 cfm (+/−4% variation), 475 to 525 cfm (+/−5% variation), including all values and sub-ranges in between.

The valve 100*a* may allow various fluids to pass through the passage 113 including, but not limited to, air, coolant vapor, water vapor, and any combinations of the foregoing substances. For example, when the valve 100*a* is used as an outlet valve, the fluid may be a mixture of air and coolant vapor. In another example, when the valve 100*a* is used as an inlet valve, the fluid may be a mixture of air and water vapor.

In some implementations, the valve 100*a* may both support a relatively high flow rate of fluid when open and have a relatively low-pressure threshold based on the respective ranges for the flow rate and pressure threshold described above. In other words, the valve 100*a* may be a high flow, low cracking pressure relief valve. When coupled to a tank of a two-phase immersion cooling system, the valve 100*a* may thus open in response to relatively small pressure differences between the tank pressure and the ambient pressure (or the pressure within a secondary containment unit coupled to the tank, such as a bellows assembly). Once open, the high flow rates supported by the valve 100*a* allow the tank pressure to be equilibrated relatively quickly. In this manner, the valve 100*a* may help regulate and maintain the tank pressure to be approximately equal to the ambient pressure when the valve 100*a* is used as either an inlet valve or an outlet valve.

In some implementations, different springs may be utilized depending on whether the valve 100*a* is used as an inlet or an outlet valve. That way, the pressure threshold to open the valve under overpressure conditions and negative pressure conditions may be different. Additionally, it should be appreciated the valve 100*a* is a passive component (i.e., the valve 100*a* does not receive electrical power or an electrical signal to facilitate movement of the poppet assembly 140 between and including the closed position and the open position), thus simplifying integration into a two-phase immersion cooling system.

The foregoing properties of the valve 100*a*—in particular, the support of relatively high flow rates of fluid—may be achieved, in part, by various improvements to the mechanical design of the valve 100*a* that increase mechanical stability and reduce undesirable vibrations particularly when a fluid passes through the valve 100*a* at relatively high flow rates.

In conventional pressure relief valves, a spring mechanism is typically used to apply a spring force to a poppet that keeps the poppet at a closed position. When an external force is applied to the poppet (e.g., the force arising from a fluid applying pressure onto the poppet) in opposition to the spring force that exceeds the spring force, the poppet moves to an open position, thus allowing fluid to pass through the valve. When a fluid passes by the spring in a conventional valve at a high flow rate (e.g., greater than or equal to 50 cfm), the forces acting on the spring by the fluid can result in excessive vibrations that cause the spring to buckle and deflect side to side. This, in turn, may cause the poppet to rock side to side generating more vibration. These vibrations may increase the friction between the poppet and a valve body supporting the poppet, thus preventing the poppet from sealing the valve at the closed position and ultimately resulting in mechanical failure of the valve.

The valve 100*a* of FIGS. 2A-2C addresses the above limitations of conventional valves as follows. The valve 100*a* body may have a sufficiently large passage 113 to support the relatively high flow rates of fluid at relatively low-pressure differences between the first opening 114 and the second opening 115 of the passage 113. For example, the passage 113 may have a diameter, $D_{valve}$, ranging from about 2 inches to about 6 inches, including all values and sub-ranges in between. For example, the diameter, $D_{valve}$, is about 5 inches.

The spring 170 may be a helical spring. The spring 170 is dimensioned to have a relatively larger diameter so that the spring 170 applies the spring force more uniformly across a larger area of the spring retainer 154 and a reactive spring force is applied more uniformly across a larger area of the support bridge 118, thus improving lateral stability and counteracting wobble of the poppet 142 when subjected to fluid flow at high flow rates. For example, the spring 170 may have a diameter, $D_{spring}$, that ranges from about 1.5 inches to about 1.7 inches, including all values and sub-ranges in between. In some implementations, the diameter, $D_{spring}$, is about 1.6 inches. Generally, the dimensions of the spring may be selected according to the diameter of the passage 113 and/or the desired flow rate supported by the valve 100*a*. In some implementations, the spring 170 may be formed from various metals including, but not limited to, 316 stainless steel.

The spring 170 may further be disposed within notches 123 formed on the support bridge 118 and the spring retainer 154, reducing or, in some instances, eliminating unwanted lateral movement and/or buckling of the spring 170, as shown in FIGS. 2A and 2C. In some implementations, the spring 170 may be dimensioned and/or shaped to have a relatively low resonance frequency to further reduce excitation of vibrations caused by high flow rates of fluid, which typically occur at relatively higher frequencies. For example, the spring 170 may have a resonance frequency less than about 10 Hz. The term "about," when used to describe the resonance frequency of the spring 170, is intended to cover manufacturing tolerances and/or variations in the coupling of the spring 170 to the support bridge 118 and/or the retainer 154, which may affect its resonant frequency. For example, "about 10 Hz" may correspond to the following ranges: 9.9 to 10.1 Hz (+/−1% variation), 9.8 to 10.2 Hz (+/−2% variation), 9.7 to 10.3 Hz (+/−3% variation), 9.6 to 10.4 Hz (+/−4% variation), 9.5 to 10.5 Hz (+/−5% variation), including all values and sub-ranges in between.

The poppet 142 may also be laterally constrained by the guide rod 160 inserted through the guide plate opening 131 of the guide plate 130. Thus, the guide plate 130 and the support bridge 118 provide two locations of lateral support for the poppet assembly 140, which reduces undesirable lateral movement (e.g., wobble of the poppet 142) and/or vibration of the poppet 142. In some implementations, the guide rod 160 may be slidably movable through the guide plate opening 131 without any lubricant between the guide rod 160 and the guide plate 131.

The respective dimensions of the guide rod 160, the guide plate opening 131, the stem 150, and/or the support bridge opening 119 may be chosen with sufficient tolerances so that the guide rod 160 remains slidably movable through the guide plate opening 131 and the stem 150 remains slidably movable through the support bridge opening 119 when the valve 100*a* is subjected to different operating conditions. For example, the valve 100*a* may be heated by the fluid during operation, which may cause the dimensions of the guide rod 160, the guide plate opening 131, the stem 150, and/or the support bridge opening 119 to change due to thermal expansion. The dimensions of the guide rod 160, the guide plate opening 131, the stem 150, and/or the support bridge opening 119 may thus include sufficient tolerances to accommodate a range of operating temperatures. For example, the valve 100*a* may support operating temperatures ranging from about 10° C. to about 90° C., including all values and sub-ranges in between. The term "about," when used to describe the operating temperature of the spring, is intended to cover manufacturing tolerances and/or variations in the coupling of the spring 170 to the support bridge 118 and/or the retainer 154, which may affect its resonant frequency. For example, "about 50° C." may correspond to the following ranges: 49.5° C. to 50.5° C. (+/−1% variation), 49° C. to 51° C. (+/−2% variation), 48.5° C. to 51.5° C. (+/−3% variation), 48° C. to 51° C. (+/−4% variation), 47.5° C. to 52.5° C. (+/−5% variation), including all values and sub-ranges in between.

In some implementations, the guide plate 130 may also be shaped, dimensioned, and/or formed of materials that dampen vibrations. For example, the guide plate 130 may be formed from aluminum. The guide plate 130 may have a length ranging from about 4 inches to about 6 inches. Preferably, the guide plate 130 may have a length of about 5 inches. The guide plate 130 may have a thickness ranging from about 0.05 inches to about 0.15 inches. Preferably, the guide plate 130 has a thickness of about 0.1 inches. It should be appreciated the foregoing materials and dimensions of the guide plate 130 are non-limiting and that the guide plate 130 may be formed from other materials and/or have other dimensions that result in similar or the same mechanical properties as above.

The term "about," when used to describe the dimensions of the passage 113, the guide plate 130, and/or the spring 170, is intended to cover manufacturing tolerances. For example, "about 1 inch" may correspond to the following dimensional ranges: 0.99 to 1.01 inch (+/−1% tolerance), 0.992 to 1.008 inch (+/−0.8% tolerance), 0.994 to 1.006 inch (+/−0.6% tolerance), 0.996 to 1.004 inch (+/−0.4% tolerance), 0.998 to 1.002 inch (+/−0.2% tolerance), including all values and sub-ranges in between.

1.1 Example Installation Locations on a Two-Phase Immersion Cooling System

The valve 100*a* may be integrated into a two-phase immersion cooling system. The relatively higher fluid flow rates supported by the valve 100*a* may allow the cooling system to support relatively higher-power density computing systems. Generally, the immersion cooling systems disclosed herein may support computing systems with a power density greater than 250 kW per enclosure at peak power. For example, the immersion cooling systems disclosed herein may support computing systems having a peak power density ranging from about 250 kW to about 1000 kW per enclosure, including all values and sub-ranges in between. More preferably, the immersion cooling systems disclosed herein may support computing systems having a peak power density ranging from about 500 kW to about 1000 kW, including all values and sub-ranges in between. Herein, the power density is defined per enclosure (i.e., per tank). It should be appreciated that the computing systems contained within a given enclosure may include one or more racks of servers. Additionally, the peak power corresponds to an upper limit in the power generated by the computing system contained within the tank of the cooling system. In other words, the computing system may generally have a power density that ranges from 0 kW to the peak power during operation. It should also be appreciated that the computing system may sustain the peak power over a prolonged period of time (e.g., more than 1 minute, more than 1 hour, more than 1 day).

Figure 4A:
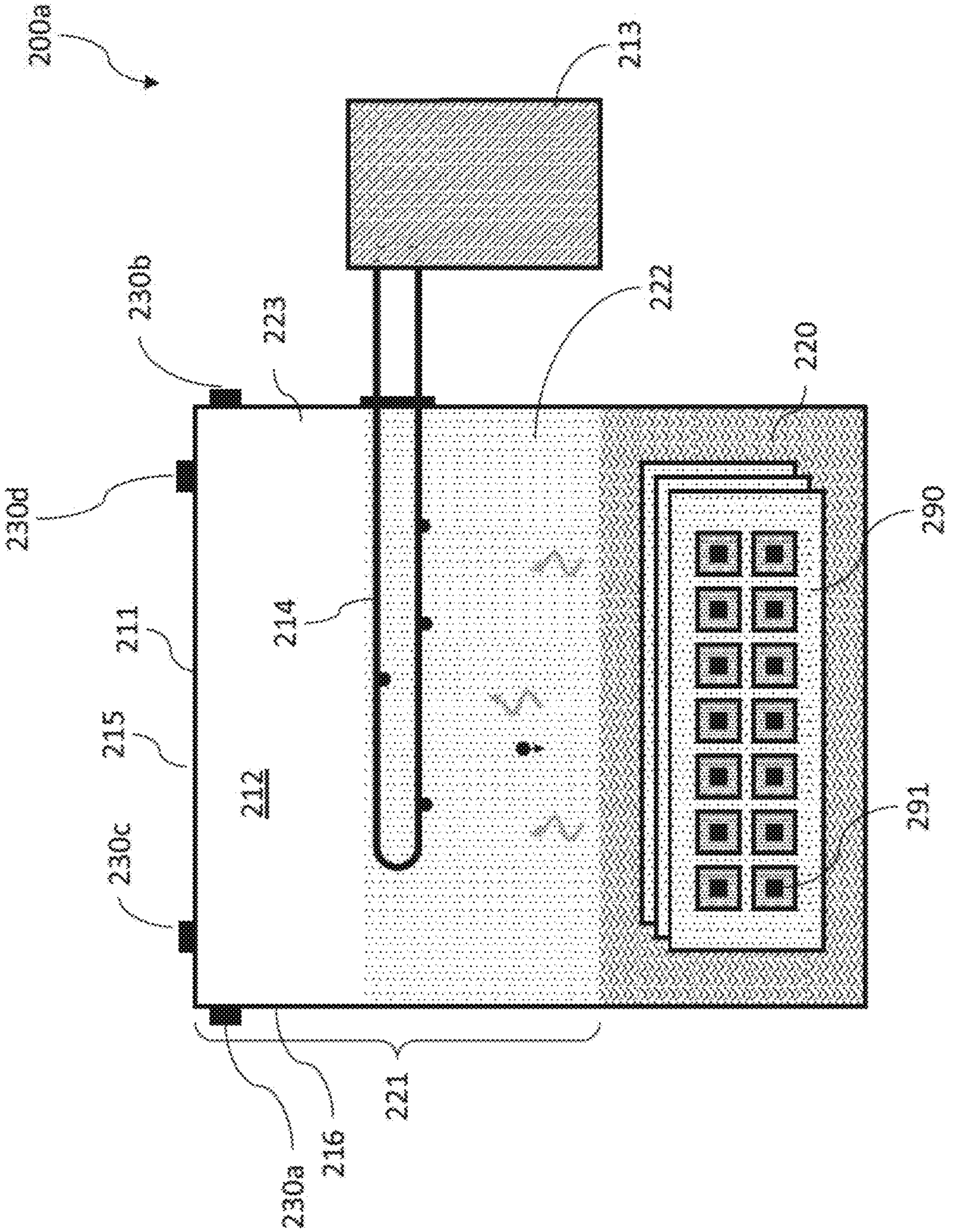
FIG. 4A shows an example two-phase immersion cooling system with multiple pressure relief valves of FIG. 2A coupled to a tank of the cooling system.

In one example, FIG. 4A shows a two-phase immersion cooling system 200*a* (hereafter referred to as the "system 200*a*"). As shown, the system 200*a* includes a tank 211 defining a tank volume 212 configured to contain one or more printed circuit boards (PCBs) 290 with respective semiconductor die 291 that generate heat during operation. The tank volume 212 further contains a portion of a condenser coil 214 (of a heat exchanger), which is fluidically coupled to a cooling distribution unit 213. The cooling distribution unit 213 may include, for example, a dry cooler, a trim chiller, and/or both.

During operation, the PCBs 290 are submerged in a pool of coolant liquid 220. When the semiconductor die 291 generates heat, the coolant liquid 220 in contact with the semiconductor die 291 is heated and vaporized generating coolant vapor 222. The coolant vapor 222 may then rise upwards into a gas space 221 located above the coolant liquid 220. When the coolant vapor 222 contacts the condenser coil 214, the coolant vapor 222 is cooled (i.e., heat is transferred from the coolant vapor 222 to a secondary coolant carried by the condenser coil 214), which causes the coolant vapor 222 to condense back to a liquid. Droplets of coolant liquid may thereafter fall from the condenser coil 214 back into the pool of coolant liquid 220 located below to replenish the supply of coolant liquid 220.

The coolant liquid 220 may be various fluorocarbon-based coolants (also referred to as "fluorochemical fluids") including, but not limited to, fluoroketone.

One or more valves 100*a* may be directly coupled to a top portion 215 and/or a side portion 216 (see, for example, valves 230*a*, 230*b*, 230*c*, and 230*d* in FIG. 4A). The valves 230*a*, 230*b*, 230*c*, and 230*d* may each include the valve 100*a* described above and be configured for use as either an inlet valve or an outlet valve. In some implementations, multiple valves 100*a* may be directly coupled to the tank 211 to provide several openings for fluid to either flow from the tank volume 212 to the surrounding ambient environment (i.e., the valves 100*a* are used as outlet valves) or flow from the ambient environment into the tank volume 212 (i.e., the valves 100*a* are used as inlet valves).

The valves 230*a* and 230*b* may generally be mounted to the side portion 216 of the tank 211 such that the valves 230*a* and 230*b* are located above at least the coolant liquid 220 during operation of the system 200*a*. In some implementations, the valves 230*a* and 230*b* may be mounted to the side portion 216 of the tank 211 to exploit the stratification of coolant vapor 222 and air 223 within the gas space 221, which may occur when the density of coolant vapor 222 is greater than air 223. For example, FIG. 4A shows a first layer of coolant vapor 222 directly above the coolant liquid 220 and a second layer of air 223 directly above the first layer. As shown, the valves 230*a* and 230*b* may be mounted sufficiently close to the top portion 215 of the tank 211 so that the valves 230*a* and 230*b* are generally located above the first layer of coolant vapor 222 and/or next to the second layer of air 223 during operation. That way, if the valves 230*a* and 230*b* are configured to function as outlet valves, the air 223 from the second layer is preferentially transferred to the ambient environment when the valves 230*a* and 230*b* are opened under overpressure conditions, thus reducing the loss of coolant vapor 222.

When the valve 100*a* is used as an outlet valve, the valve 100*a* may be mounted to the highest location of the tank 211 (e.g., the valves 230*c* and 230*d* mounted to the top portion 215) to reduce the loss of coolant vapor 222. When the valve 100*a* is used as an inlet valve, the valve 100*a* may generally be mounted to the tank 211 such that the valve 100*a* is located above the coolant liquid 220 during operation. It should be appreciated that the first layer may include trace amounts of air 223 (i.e., the first layer includes a first fluid consisting essentially of coolant vapor 222). The second layer may include trace amounts of coolant vapor 222 (i.e., the second layer includes a second fluid consisting essentially of air 223).

The inclusion of multiple valves in the system 200*a* may provide a way for the system 200*a* to support higher total flow rates of fluid passing into or out of the tank 211. For example, if the valves 230*a* and 230*b* are configured as outlet valves with each valve 230*a* and 230*b* supporting a fluid flow rate up to 600 cfm, the combination of the valves 230*a* and 230*b* may allow the system 200*a* to vent air and/or coolant vapor from the tank volume 212 at a flow rate up to 1200 cfm.

In some implementations, the system 200*a* may include a different number of inlet valves and outlet valves. For example, the fluid flow rates are typically higher for overpressure conditions compared to negative pressure conditions. Thus, the system 200*a* may include more outlet valves than inlet valves to accommodate the higher flow rates. This may be accomplished by selecting three of the valves 230*a*, 230*b*, 230*c*, and 230*d* to be outlet valves and the remaining valve to be an inlet valve.

Figure 4B:
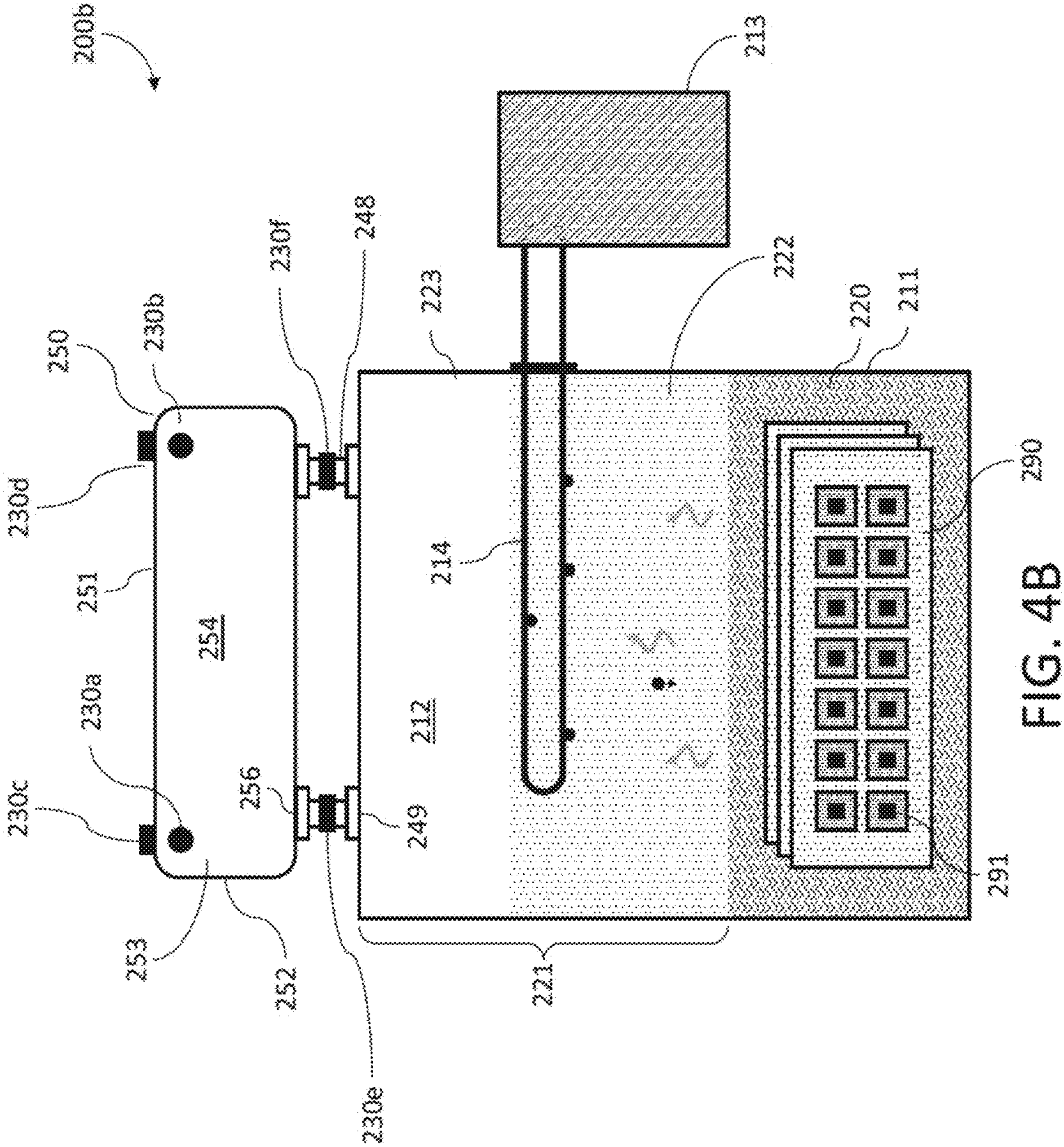
FIG. 4B shows another example two-phase immersion cooling system with a bellows assembly and multiple pressure relief valves of FIG. 2A coupled to the bellows assembly.

FIG. 4B shows another example two-phase immersion cooling system 200*b* (hereafter referred to as the "system 200*b*") that includes a bellows assembly 250 fluidically coupled to the tank 211 via a pair of venting tubes 248 coupled to respective ports 249 on the tank 211. The bellows assembly 250 may include a container 252 defining a container volume 254. The bellows assembly 250 may function as a secondary containment unit configured to receive and store air 223 and/or coolant vapor 222 from the tank 211 when the tank pressure increases and supply and transfer air 223 and/or coolant vapor 222 to the tank 211 when the tank pressure decreases during operation. Further details and examples of a bellows assembly 250 may be found in International PCT Application No. PCT/US23/67056, filed on May 16, 2023, entitled, "Bellows for Immersion Cooling," which is incorporated by reference herein in its entirety.

One or more valves 100*a* may be directly coupled to a top portion 251 and/or a side portion 253 of the bellows assembly 250 (see, for example, valves 230*a*, 230*b*, 230*c*, and 230*d* in FIG. 4B). The valves 230*a*, 230*b*, 230*c*, and 230*d* may each include the valve 100*a* described above and be configured for use as either an inlet valve to flow air from the ambient environment into the container volume 254 when the bellows assembly 250 is in a negative pressure condition or an outlet valve to vent air from the container volume 254 to the ambient environment when the bellows assembly 250 is in an overpressure condition.

In some implementations, the valve 100*a* may also be disposed between the tank 211 and the bellows assembly 250. For example, FIG. 4B shows the valves 230*e* and 230*f* may be incorporated into respective venting tubes 248. Similar to the valves 230*a*, 230*b*, 230*c*, and 230*d*, the valve 230*e* and 230*f* may each include the valve 100*a* described above and be configured for use as either an inlet valve or an outlet valve. In this manner, the valves 230*e* and 230*f* may control the transfer of air 223 and/or coolant vapor 222 between the tank volume 211 and the container volume 254. For example, the air 223 and/or coolant vapor 222 may transfer from the tank volume 211 into the container volume 254 only when the tank pressure is greater than the pressure within the container volume 254 and the pressure difference exceeds a first predetermined pressure threshold. Similarly, air 223 and/or coolant vapor 222 may transfer from the container volume 254 into the tank volume 212 only when the tank pressure is less than the pressure within the container volume 254 and the pressure difference exceeds a second pressure threshold.

It should be appreciated that while the system 200*a* depicted in FIG. 4A includes four valves (e.g., valves 230*a*-230*d*) and the system 200*b* depicted in FIG. 4B includes six valves (e.g., valves (e.g., valves 230*a*-230*f*), any number of valves may be mounted to the systems 200*a* or 200*b* provided sufficient space is available on the tank 211 and/or the bellows assembly 250. Additionally, in some implementations, a cooling system may include one or more valves (inlet valves or outlet valves) mounted directly to the tank 211 and one or more valves (inlet valves or outlet valves) mounted directly to a secondary containment unit fluidically coupled to the tank 211 (e.g., the bellows assembly 250). Furthermore, the respective pressure thresholds to open an inlet or outlet valve mounted to the tank 211 or the bellows assembly 250 may be configured to be different (e.g., by using springs 170 with different spring constants). For example, the valves mounted directly to the tank 211 may have a higher pressure threshold compared to the valves to the secondary containment unit so that the valves on the secondary containment unit are more likely to open before the valves on the tank 211 in the event the system experiences overpressure or negative pressure conditions.

1.2 Example Outlet Valve Assemblies

As described above, the valve 100*a* may be used as an outlet valve to release air and/or coolant vapor when a two-phase immersion cooling system experiences overpressure conditions. When the PCBs disposed within a two-phase immersion cooling system starts up, increases load, and/or operates at a constant load, the heat produced causes the generation of coolant vapor that flows upward into the gas space above the pool of coolant liquid. As more coolant vapor is generated, the pressure within the gas space increases. Overpressure conditions may occur when the tank pressure is greater than the ambient pressure.

To alleviate the overpressure conditions and/or to avoid an overpressure-related failure, one or more valves 100*a* may be installed into the cooling system as an outlet valve. Once the tank pressure increases to a point where the pressure difference across the valve 100*a* exceeds the pressure threshold, the valve 100*a* may open (e.g., the poppet assembly 140 moves from the closed position to the open position) to release air from the tank into the ambient environment. The tank pressure thereafter decreases and once the tank pressure sufficiently decreases to a point where the pressure difference is less than the pressure threshold of the valve 100*a*, the spring 170 of the valve 100*a* may move the poppet assembly 140 back to the closed position to seal the passage 113. The valve 100*a* may be utilized as an outlet valve in several ways, as described below.

Figure 5:
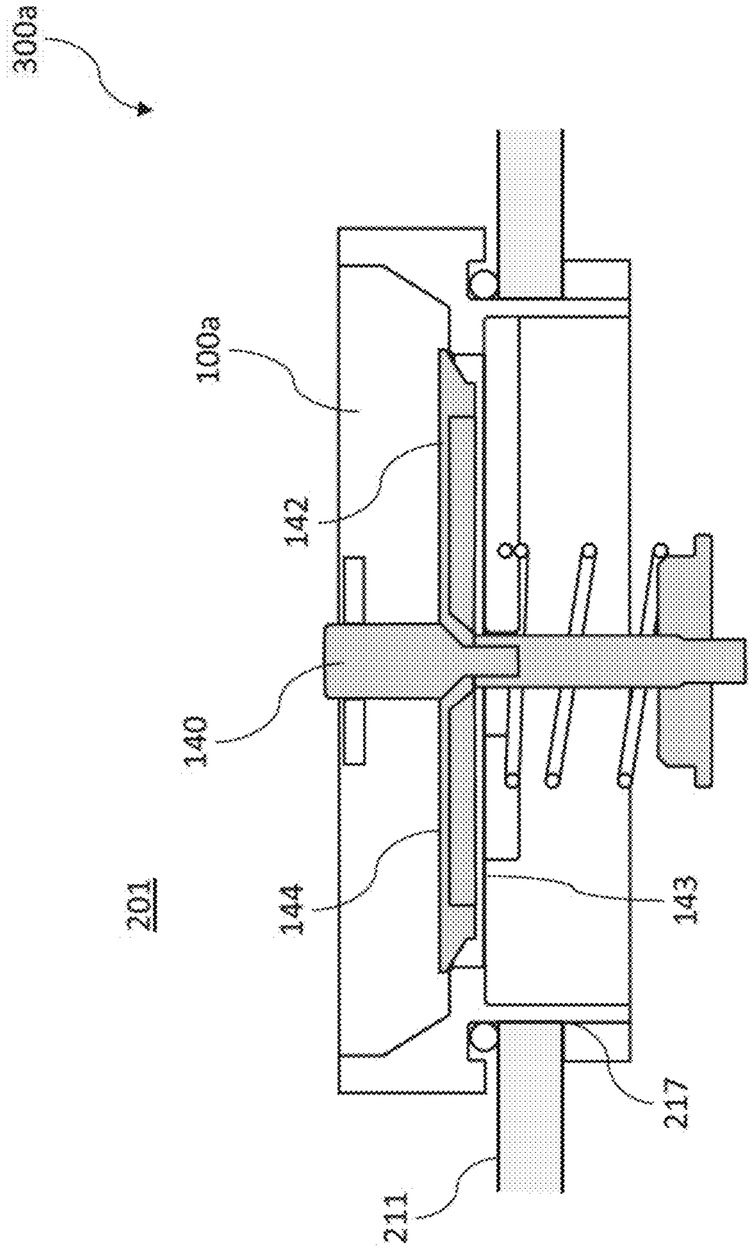
FIG. 5 shows a cross-sectional side view of an example outlet valve assembly that includes the pressure relief valve of FIG. 2A directly coupled to a tank of a two-phase immersion cooling system.

In one example, FIG. 5 shows an example outlet valve assembly 300*a* where the valve 100*a* is directly mounted to a tank 211 via a tank opening 217 of a two-phase immersion cooling system (e.g., sec system 200*a*). It should be appreciated the outlet valve assembly 300*a* may also be directly mounted to a secondary containment unit fluidically coupled to the tank 211, such as the bellows assembly 250 of the system 200*b*. As shown, the valve 100*a* may be mounted such that the first side 143 of the poppet 142 faces the tank volume 212 and the second side 144 of the poppet 142 faces the ambient environment 201. In this example, the first side 143 may thus be considered an inner side of the poppet 142 and the second side 144 may be considered an outer side of the poppet 142. Thus, the poppet assembly 140 only moves from the closed position to the open position when the tank pressure is greater than the ambient pressure and the pressure difference across the poppet 142 is greater than the predetermined pressure threshold of the valve 100*a*.

In another example, FIG. 6 shows an example outlet valve assembly 300*b* that includes the valve 100*a* and an adsorbent chamber 320. As shown, the valve 100*a* may be mounted to the adsorbent chamber 320 via a valve chamber 310. The adsorbent chamber 320, in turn, may be mounted to a tank 211 via a tank opening 217 of a two-phase immersion cooling system. Various coupling mechanisms may be used to couple the valve chamber 310 to the adsorbent chamber 320 and/or the adsorbent chamber 320 to the tank 211 including, but not limited to, a latch (see the latches 460 in FIGS. 9A-9E), screw fasteners, bolt fasteners, and the like. O-rings 302 may also be included between the valve chamber 310 and the adsorbent chamber 320 and between the adsorbent chamber 320 and the tank 211 to seal the respective interfaces.

The valve chamber 310 may include a chamber wall 311 that defines an opening 312 through which the valve 100*a* is inserted and mounted (e.g., via the mounting ring 116) to the chamber wall 311. In some implementations, the valve chamber 310 may also include a screen 314 to reduce or, in some instances, mitigate passage of material through the valve 100*a* when the valve 100*a* is open. For example, the screen 314 may prevent loose material from the filters 330 from passing through the valve 100*a*. The screen 314 may be a plate with multiple holes and/or a mesh screen configured to allow a mixture of air and/or coolant vapor to pass through.

The adsorbent chamber 320 may include a chamber wall 321 that defines a chamber volume 322 to contain one or more filters 330. The filters 330 may be configured to remove and capture coolant vapor from the air as a mixture of air and coolant vapor passes through the filter(s) 330. In some implementations, the filters 330 may filter the mixture by selectively allowing passage of smaller-sized molecules (e.g., air molecules) while inhibiting passage of larger-sized molecules (e.g., the coolant vapor). For example, when the valve 100*a* opens due to excessive overpressure conditions within the tank, a mixture of air and coolant vapor may flow through the adsorbent chamber 320 and the valve chamber 310 from the tank volume 212 towards the ambient environment 201. By capturing at least some of the coolant vapor in the air from the tank volume 212, less coolant is lost.

Once the filters 330 are saturated with coolant vapor, the filters 330 may be removed and processed to extract the coolant for reuse in the cooling system. This may be accomplished, in part, by removing the valve chamber 310 (e.g., by disengaging one or more latches) and thereafter removing the adsorbent chamber 320 from the tank 211 (e.g., by disengaging one or more latches). The filters 330 within the adsorbent chamber 320 may then be removed and replaced with new filters 330 before the adsorbent chamber 320 and the valve chamber 310 are reinstalled onto the tank 211. Alternatively, a new adsorbent chamber 320 with a new set of filters 330 may be mounted to the tank 211. In some implementations, the removal and replacement of the adsorbent chamber 320 with new filters 330 may be performed without shutting down the computing system and/or the two-phase immersion cooling system.

Figure 6A:
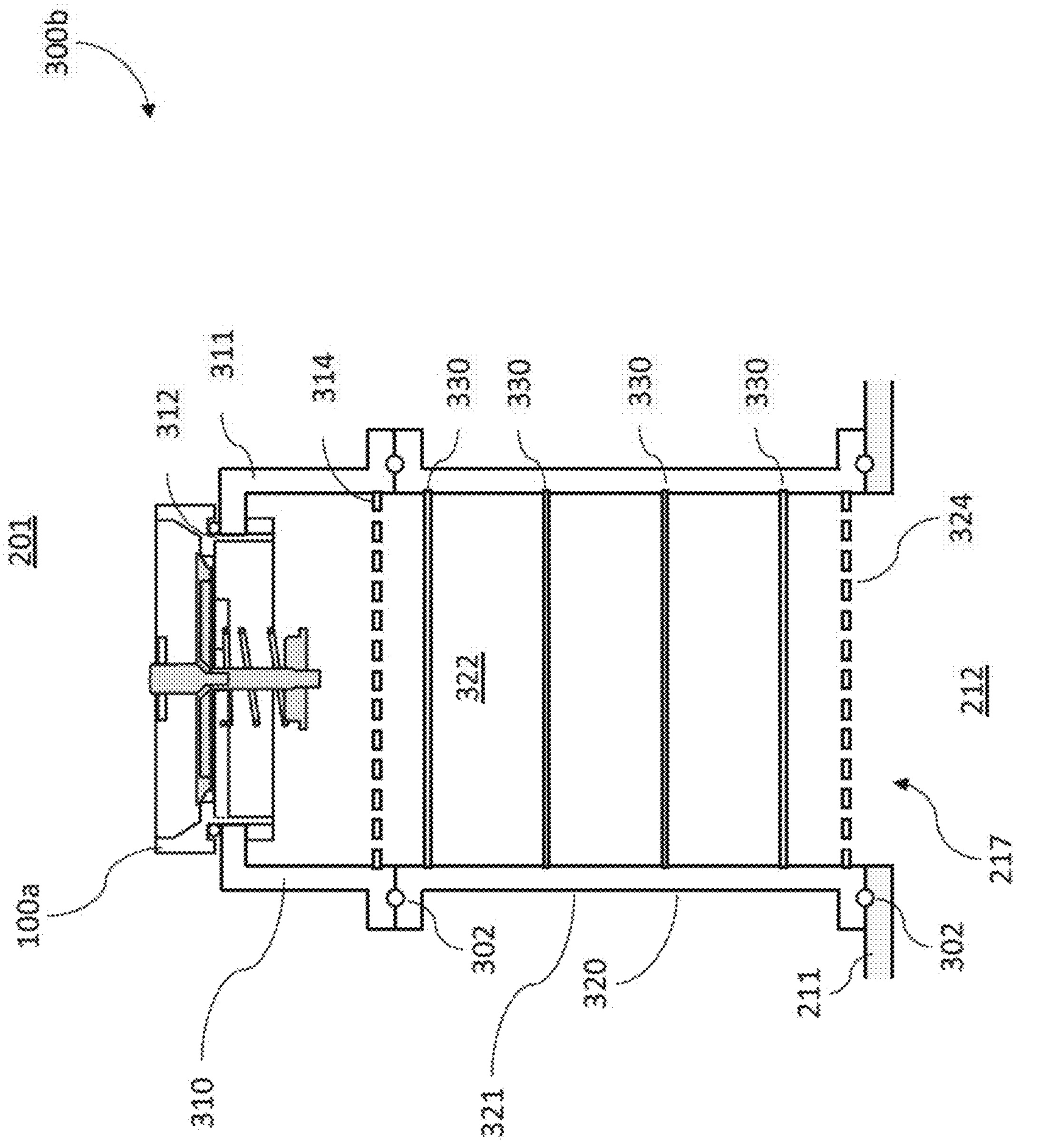
FIG. 6A shows a cross-sectional side view of another example outlet valve assembly that includes the pressure relief valve of FIG. 2A and an adsorbent chamber directly coupled to a tank of a two-phase immersion cooling system.
Figure 6B:
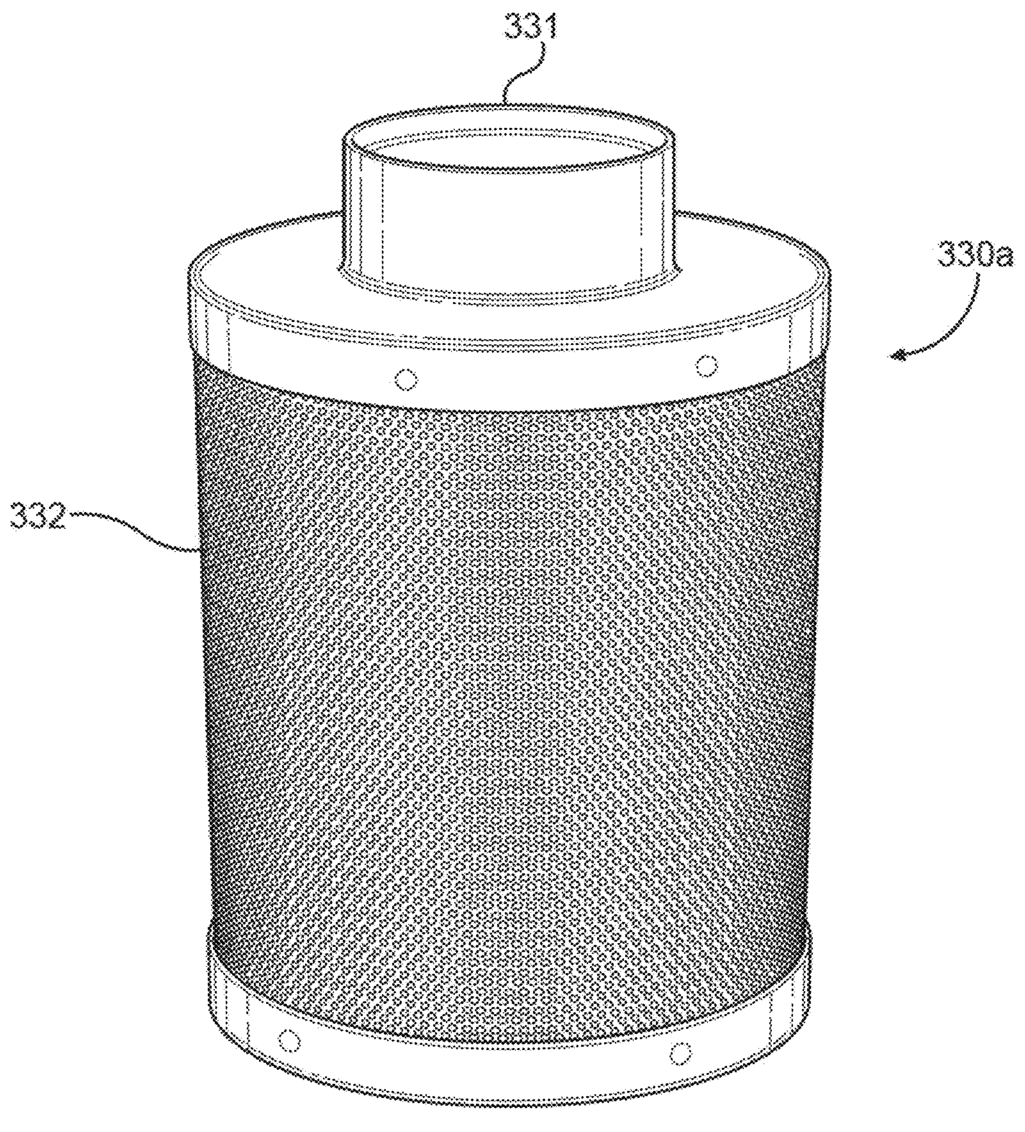
FIG. 6B shows an example filter that may be incorporated into the adsorbent chamber.

The filter(s) 330 may be mounted to an interior wall of the adsorbent chamber 320. In some implementations, the filter(s) 330 may be substantially flat membranes as shown in FIG. 6A. Multiple filter(s) 330 may thus be placed within the chamber volume 322 in series so that the mixture of air and coolant vapor passes through multiple filters to further reduce the amount of coolant vapor lost to the ambient environment 201. In another example, FIG. 6B shows an example filter 330*a* configured as a container with an inlet port 331 to receive a mixture of air and coolant vapor and an outlet portion 332 disposed along the side of the filter 330*a* through which the mixture of air and coolant vapor exits the filter 330*a*. The filter 330*a* may contain filter material to selectively remove coolant vapor from a mixture of air and coolant vapor passing through the filter 330*a*.

In some implementations, the adsorbent chamber 320 may include a screen 324 to reduce or, in some instances, mitigate passage of material (e.g., material from the filter(s) 330) from passing into the tank volume 212. The screen 324 may be identical to the screen 314.

Figure 7:
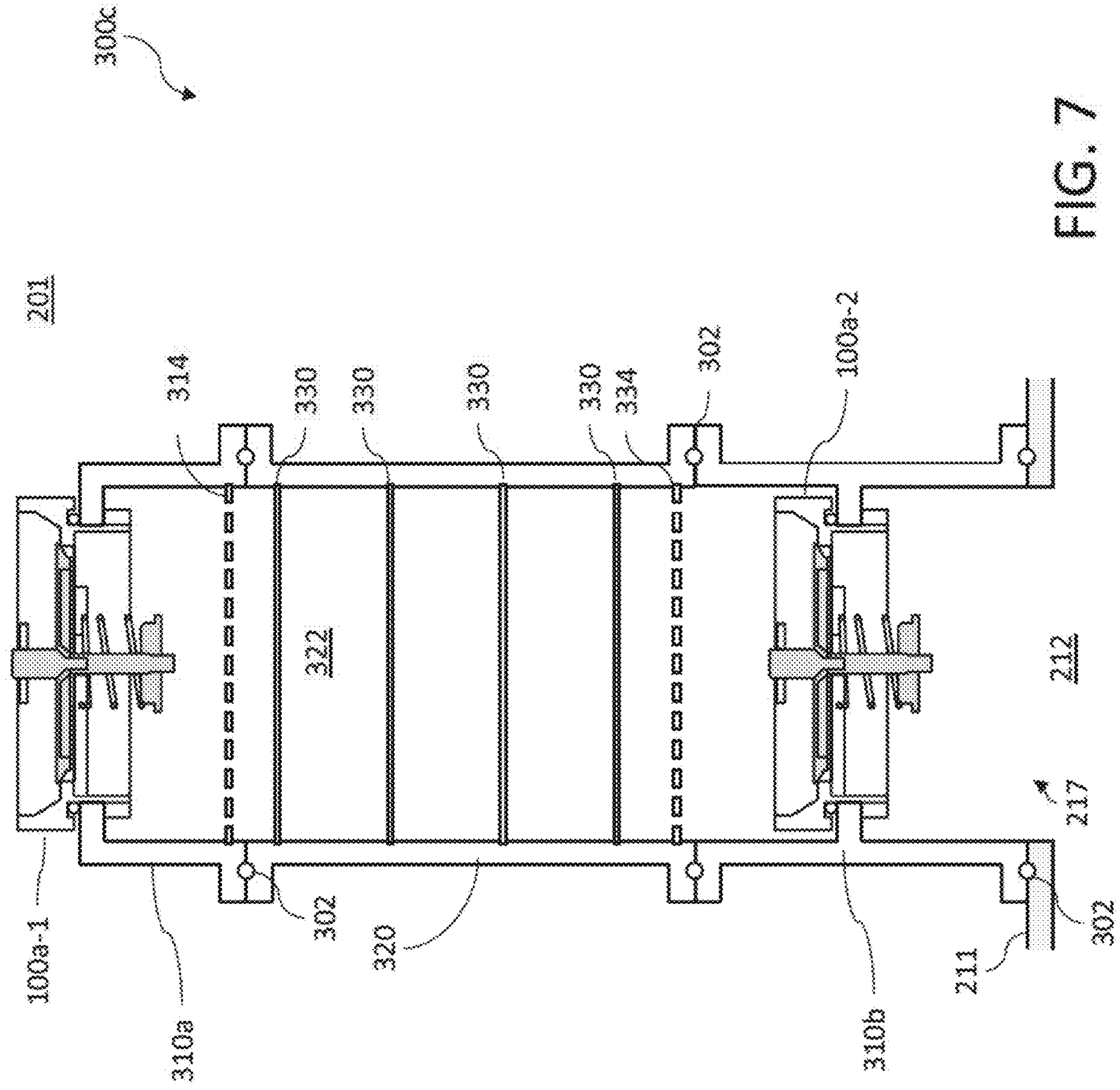
FIG. 7 shows a cross-sectional side view of another example outlet valve assembly that includes an adsorbent chamber and a pair of pressure relief valves of FIG. 2A coupled to opposite ends of the adsorbent chamber where one pressure relief valve is directly coupled to a tank of a two-phase immersion cooling system.

In yet another example, FIG. 7 shows an example outlet valve assembly 300*c* that includes valves 100*a*-1 and 100*a*-2 coupled to opposite ends of the adsorbent chamber 320 of FIG. 6 via respective valve chambers 310*a* and 310*b*. Each of the valves 100*a*-1 and 100*a*-2 may be the valve 100*a* described above. As shown, the valve chamber 310*b* for the valve 100*a*-2 is directly coupled to the tank 211 via the tank opening 217 and disposed between the tank 211 and the adsorbent chamber 320. The combination of the valves 100*a*-1 100*a*-2 provides a way to seal the chamber volume 322 of the adsorbent chamber 320 when the tank 211 is not experiencing overpressure conditions sufficient to open the valves 100*a*-1 and 100*a*-2. This, in turn, limits exposure of the filters 330 to coolant vapor only when the valves 100*a*-1 and 100*a*-2 are open, thus extending the life of the filters 330. Additionally, the valve chamber 310*a* for the valve 100*a*-1 and the adsorbent chamber 320 may be more easily removed without affecting operation of the two-phase immersion cooling system. For example, if the valve 100*a*-2 is closed, removal of the valve chamber 310*a* or the adsorbent chamber 320 would not expose the tank volume 212 to the ambient environment 201.

1.3 Example Inlet Valve Assemblies

The valve 100*a* may also be used as an inlet valve to draw in air from the ambient environment when a two-phase immersion cooling system experiences negative pressure conditions. When the PCBs disposed within a two-phase immersion cooling system shut down and/or decrease load, the heat produced by the PCBs may decrease, resulting in a corresponding decrease in the amount of coolant vapor generated. This, in turn, may decrease the pressure within the gas space above the pool of coolant liquid. If air and/or coolant vapor was previously released, e.g., via an outlet during overpressure conditions, the pressure within the gas space may decrease below ambient pressure, resulting in a negative pressure condition.

To alleviate the negative pressure condition and/or to avoid a negative pressure-related failure, one or more valves 100*a* may be installed into the cooling system as an inlet valve. Once the tank pressure decreases to a point where the pressure difference across the valve 100*a* exceeds the pressure threshold, the valve 100*a* may open (e.g., the poppet assembly 140 moves from the closed position to the open position) to pull in air from the ambient environment into the tank. The tank pressure thereafter increases and once the tank pressure sufficiently increases to a point where the pressure difference is less than the pressure threshold of the valve 100*a*, the spring 170 of the valve 100*a* may move the poppet assembly 140 back to the closed position to seal the passage 113. The valve 100*a* may be utilized as an inlet valve in several ways, as described below.

Figure 8:
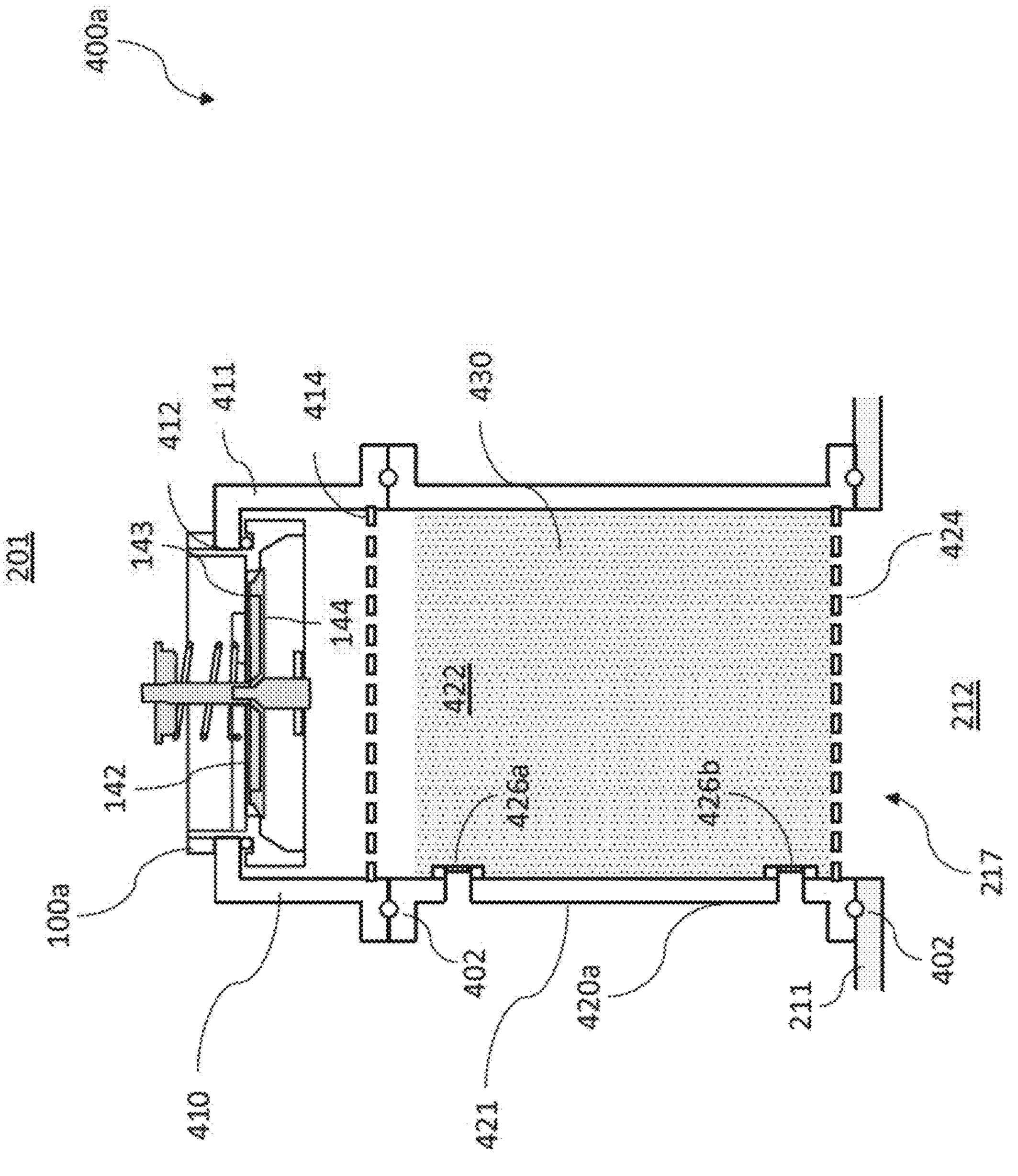
FIG. 8 shows a cross-sectional side view of an example inlet valve assembly that includes the pressure relief valve of FIG. 2A and an adsorbent chamber directly coupled to a tank of a two-phase immersion cooling system.
Figure 9A:
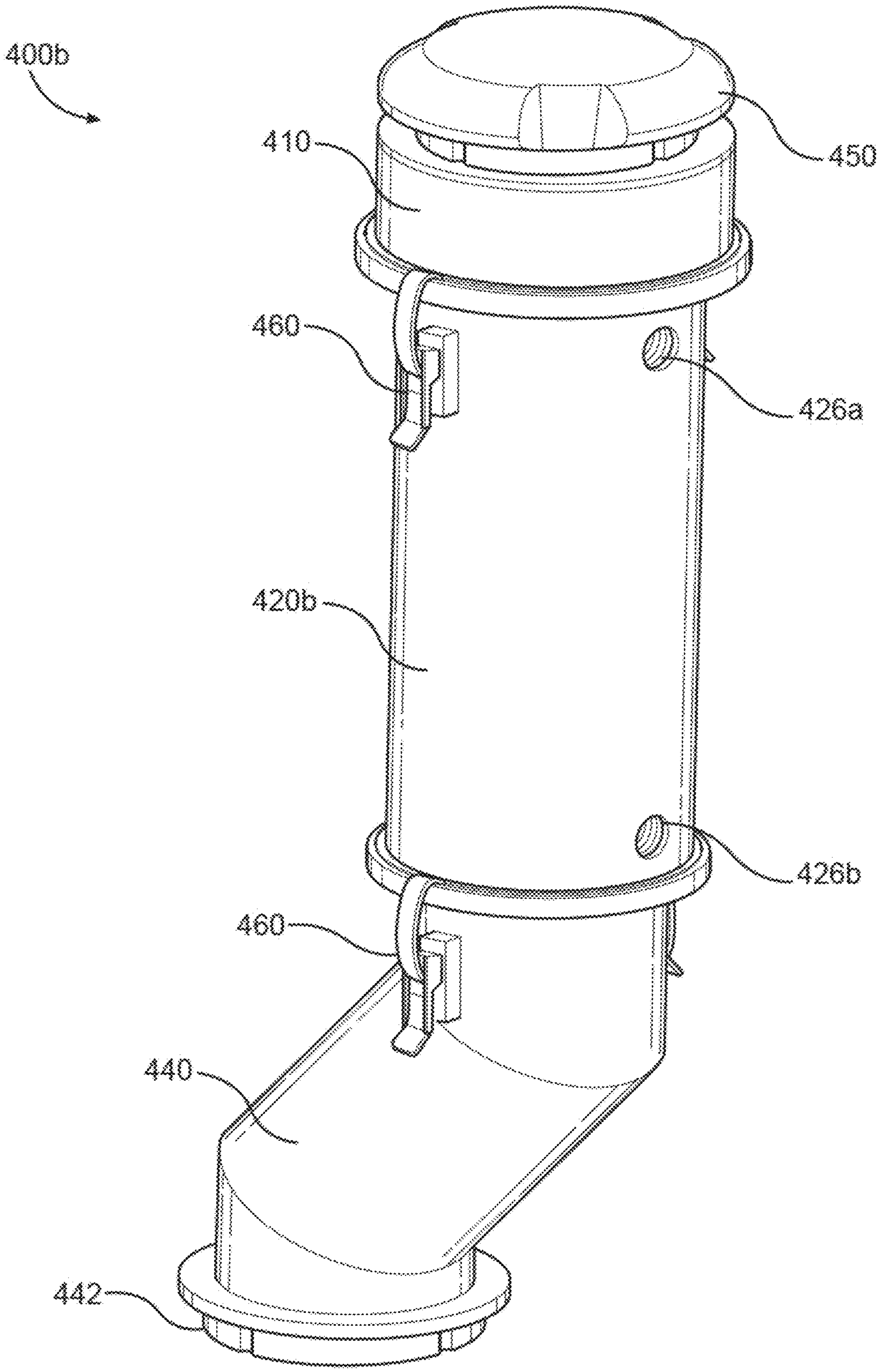
FIG. 9A shows a perspective view of another example inlet valve assembly that includes the pressure relief valve of FIG. 2A and an adsorbent chamber coupled to a tank of a two-phase immersion cooling system via a venting tube.
Figure 9B:
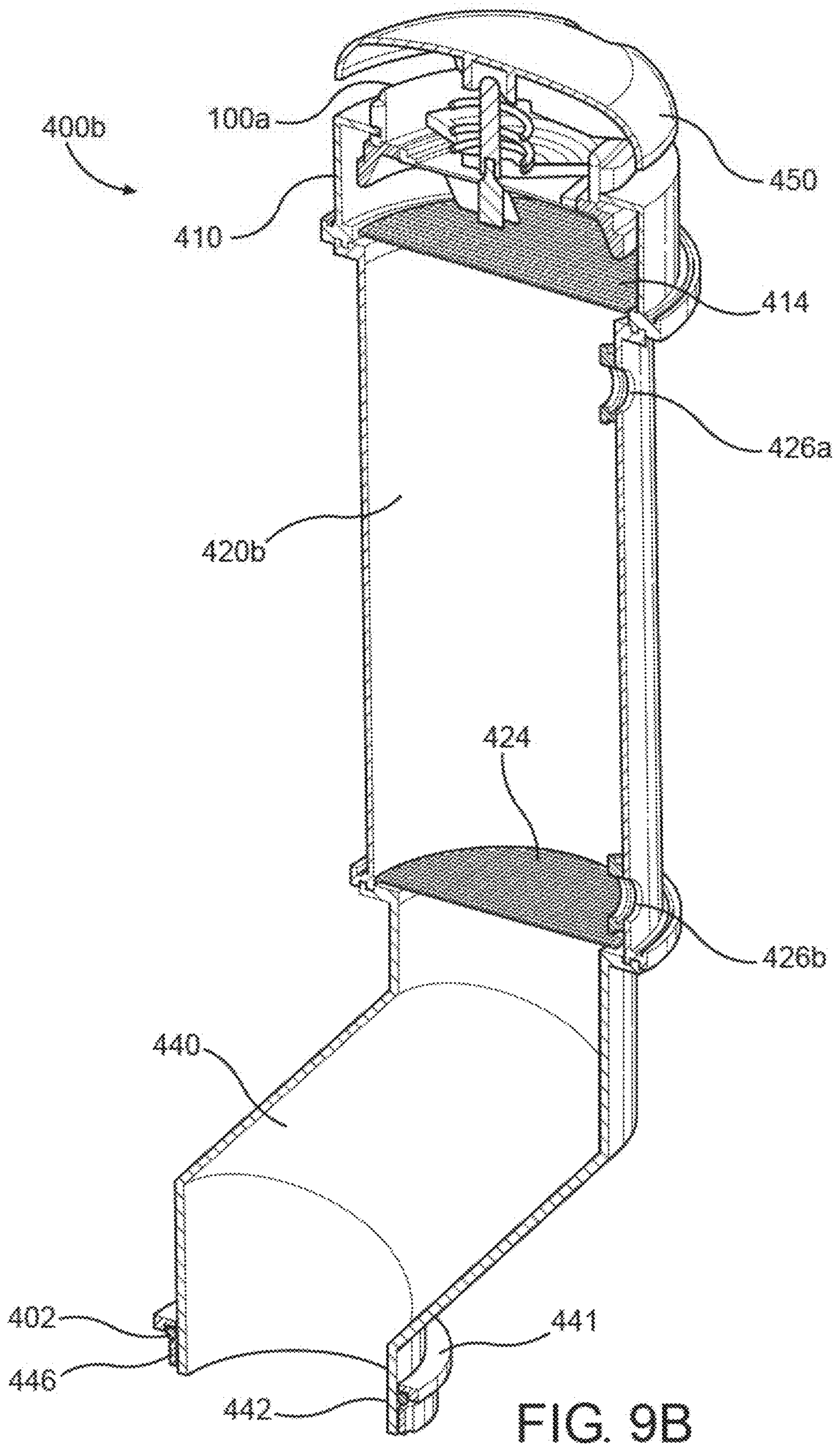
FIG. 9B shows a cross-sectional perspective view of the inlet valve assembly of FIG. 9A.
Figure 9C:
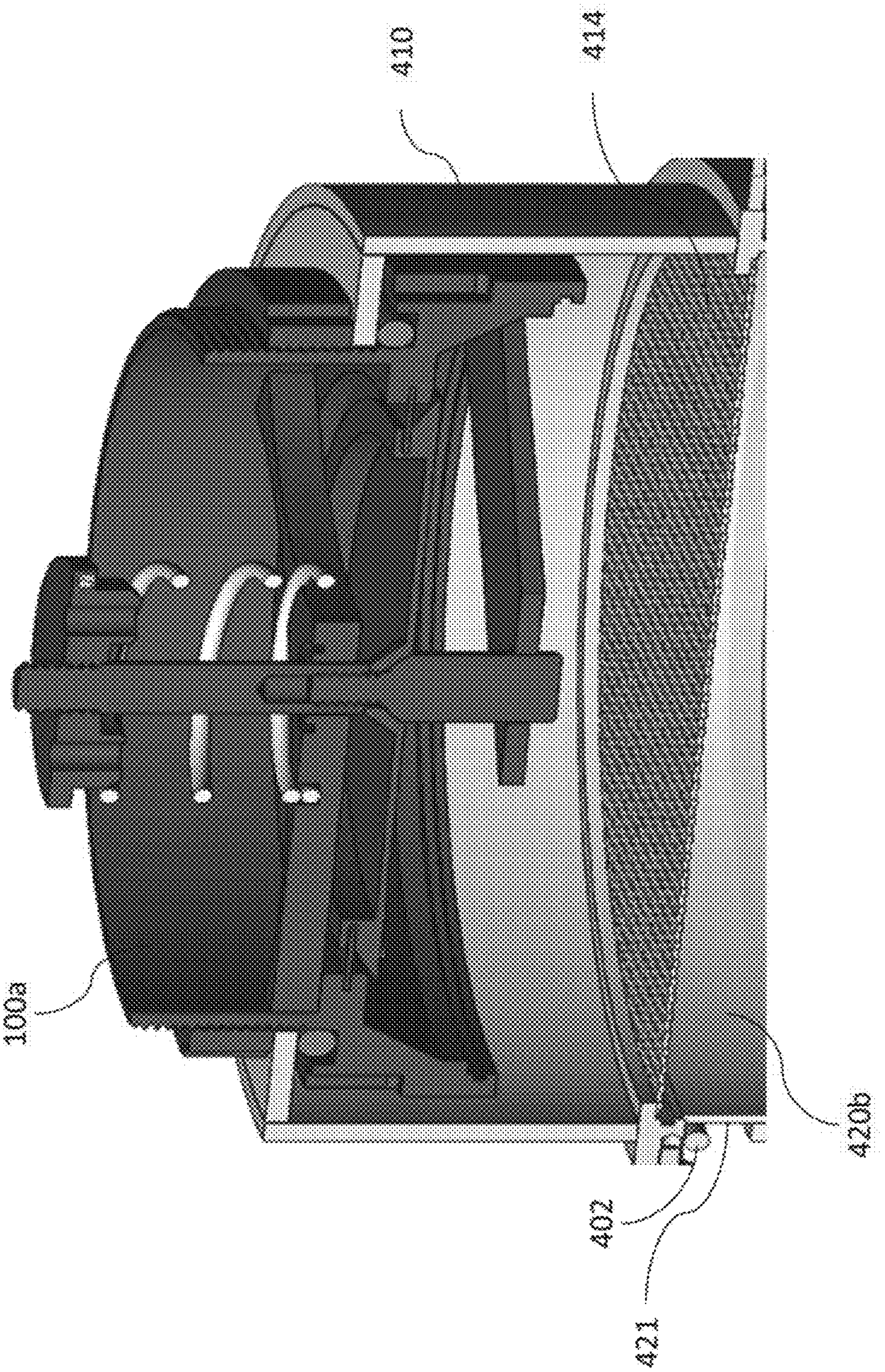
FIG. 9C shows a magnified cross-sectional perspective view of a valve chamber and the adsorbent chamber in the inlet valve assembly of FIG. 9A.
Figure 9D:
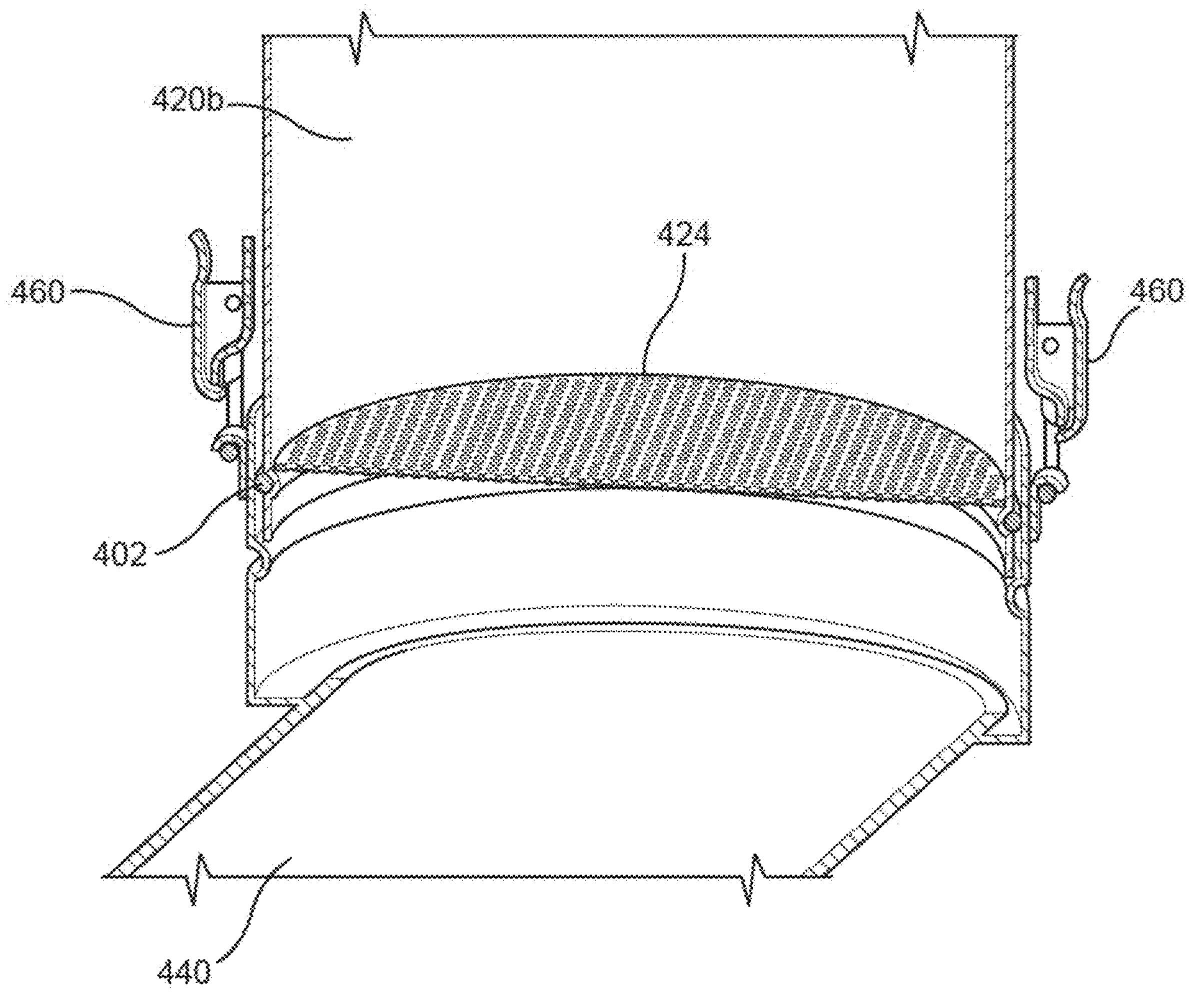
FIG. 9D shows a magnified cross-sectional perspective view of the venting tube and the adsorbent chamber in the inlet valve assembly of FIG. 9A.
Figure 9E:
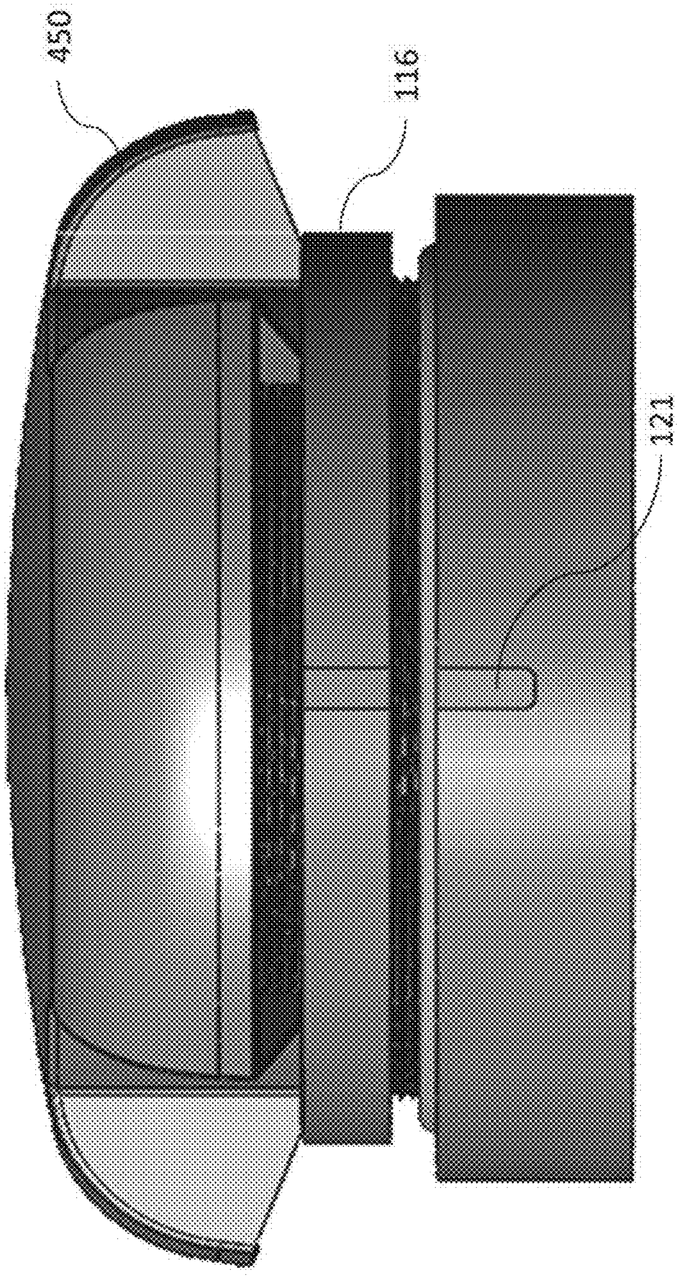
FIG. 9E shows a magnified side view of a dust cap in the inlet valve assembly of FIG. 9A.

FIG. 8 shows an example inlet valve assembly 400*a* that includes the valve 100*a* coupled to an adsorbent chamber 420*a* via a valve chamber 410. The valve chamber 410 and the adsorbent chamber 420*a* may share several of the same features as the valve chamber 310 and the adsorbent chamber 320 in the outlet valve assembly 300*b*. For brevity, these details will not be repeated below unless otherwise indicated.

As shown, the valve chamber 410 includes a chamber wall 411 that defines an opening 412 through which the valve 100*a* is inserted and mounted (e.g., via the mounting ring 116) to the chamber wall 411. The valve 100*a* may be mounted to the valve chamber 410 via such that the first side 143 of the poppet 142 faces the ambient environment 201 and the second side 144 of the poppet 142 faces the adsorbent chamber 420*a*. In this example, the first side 143 may be considered an outer side of the poppet 142 and the second side 144 may be considered an inner side of the poppet 142. Thus, the poppet assembly 140 only moves from the closed position to the open position when the ambient pressure is greater than the tank pressure (the pressure in the chamber volume 422 is assumed equal to the tank pressure in this example) and the pressure difference across the poppet 142 is greater than the predetermined pressure threshold. The valve chamber 410 may further include a screen 414 to reduce or, in some instances, mitigate passage of material through the valve 100*a* when the valve 100*a* is open. For example, the screen 414 may prevent desiccant 430 from passing through the valve 100*a*. The screen 414 may be a plate with multiple holes and/or a mesh screen configured to allow a mixture of air and/or coolant vapor to pass through.

The adsorbent chamber 420*a* includes a chamber wall 421 that defines a chamber volume 422 to store desiccant 430. The desiccant 430 is configured to extract and remove water vapor from air flowing through the adsorbent chamber 420*a* (e.g., from the ambient environment 201). For example, when the valve 100*a* opens due to excessive negative pressure conditions within the tank 211, a mixture of air and water vapor may flow through the adsorbent chamber 420*a* and the valve chamber 410 from the ambient environment towards the tank volume 212. Without the desiccant 430, the water vapor in the air may contaminate the coolant liquid, e.g., by altering the chemical composition of the coolant liquid through undesirable chemical reactions. For example, water introduced into the cooling system may react with fluoroketone (i.e., the coolant liquid) to produce an acid, which may corrode components of the cooling system and/or the computing system. In some implementations, the amount of water vapor in the air may be reduced such that substantially dry air is provided to the tank volume 212. With the desiccant 430, the amount of water introduced into the cooling system from the ambient environment when alleviating negative pressure conditions may be reduced or, in some instances, eliminated entirely.

The desiccant 430 may include various hygroscopic materials including, but not limited to, silica gel, activated charcoal, calcium chloride, charcoal sulfate, a molecular sieve, and any combinations of the foregoing. The adsorbent chamber 420*a* may further include a screen 424 to support the desiccant 430 where the screen 424 has multiple holes to allow air and/or coolant vapor to pass through while preventing passage of the desiccant 430.

The adsorbent chamber 420*a* may also include one or more sight glasses (e.g., see sight glasses 426*a* and 426*b* in FIG. 8) to provide respective viewing ports for an operator to visually inspect the desiccant 430. For example, some desiccants 430 may change color as it is saturated with moisture. In some implementations, the adsorbent chamber 420*a* may include a sight glass disposed near the top of the chamber volume 422 (e.g., the sight glass 426*a*) and another sight glass (e.g., the sight glass 426*b*) disposed near the bottom of the chamber volume 422. The sight glasses 426*a* and 426*b* may include, for example, a glass window mounted to the chamber wall 421. The glass window may be sufficiently sealed to the chamber wall 421 such that no gas (e.g., air, water vapor, coolant vapor, etc.) passes through the sight glass during operation. This may be accomplished, for example, by including an O-ring between the glass window and a flange formed on the chamber wall 421.

Once the desiccant 430 is saturated with moisture, the desiccant 430 may be removed and replaced with new desiccant 430. This may be accomplished, for example, by removing the valve chamber 410 (e.g., by disengaging one or more latches) and thereafter removing the adsorbent chamber 420*a* from the tank 211 (e.g., by disengaging one or more latches). Once removed, the saturated desiccant 430 in the adsorbent chamber 420*a* may be removed and replaced with new desiccant 430 (e.g., by pouring out the saturated desiccant 430 and pouring in new desiccant 430). Then, the adsorbent chamber 420*a* and the valve chamber 410 may be reinstalled onto the tank 211. In some implementations, the removal and replacement of the adsorbent chamber 420*a* with new desiccant 430 may be performed without shutting down the computing system and/or the two-phase immersion cooling system.

FIGS. 9A-9E show another example inlet valve assembly 400*b* that shares several of the same features as the inlet valve assembly 400*a*. For brevity, these details will not be repeated below unless otherwise indicated.

As shown, the valve chamber 410 may include a dust cap 450 mounted directly to the valve 100*a*. The dust cap 450 may reduce or, in some instances, prevent unwanted contaminants from the ambient environment 201 from settling onto the valve 100*a* and/or being introduced into the tank volume 212. The dust cap 450 may include one or more snap-fit connectors that couple to the spanner features 121 of the valve body 110 (see, for example, the snap-fit connectors 452 of FIG. 11).

The valve chamber 410 may be coupled to an adsorbent chamber 420*b* via a latch 460. The inlet valve assembly 400*b* may also include a venting tube 440 to mount the inlet valve assembly 400*b* to a tank 211. As shown, the adsorbent chamber 420*b* may be mounted to the venting tube 440 via another latch 460. The venting tube 440, in turn, may be mounted to the tank 211 by inserting a threaded section 442 of the venting tube through a tank opening 217 such that an O-ring 402 supported by a flange section 441 of the venting tube 440 abuts the tank wall. A mounting ring 446 may thereafter be fastened to the threaded section 442 from within the tank volume 212 to securely couple the inlet valve assembly 400*b* to the tank 211.

Figure 10:
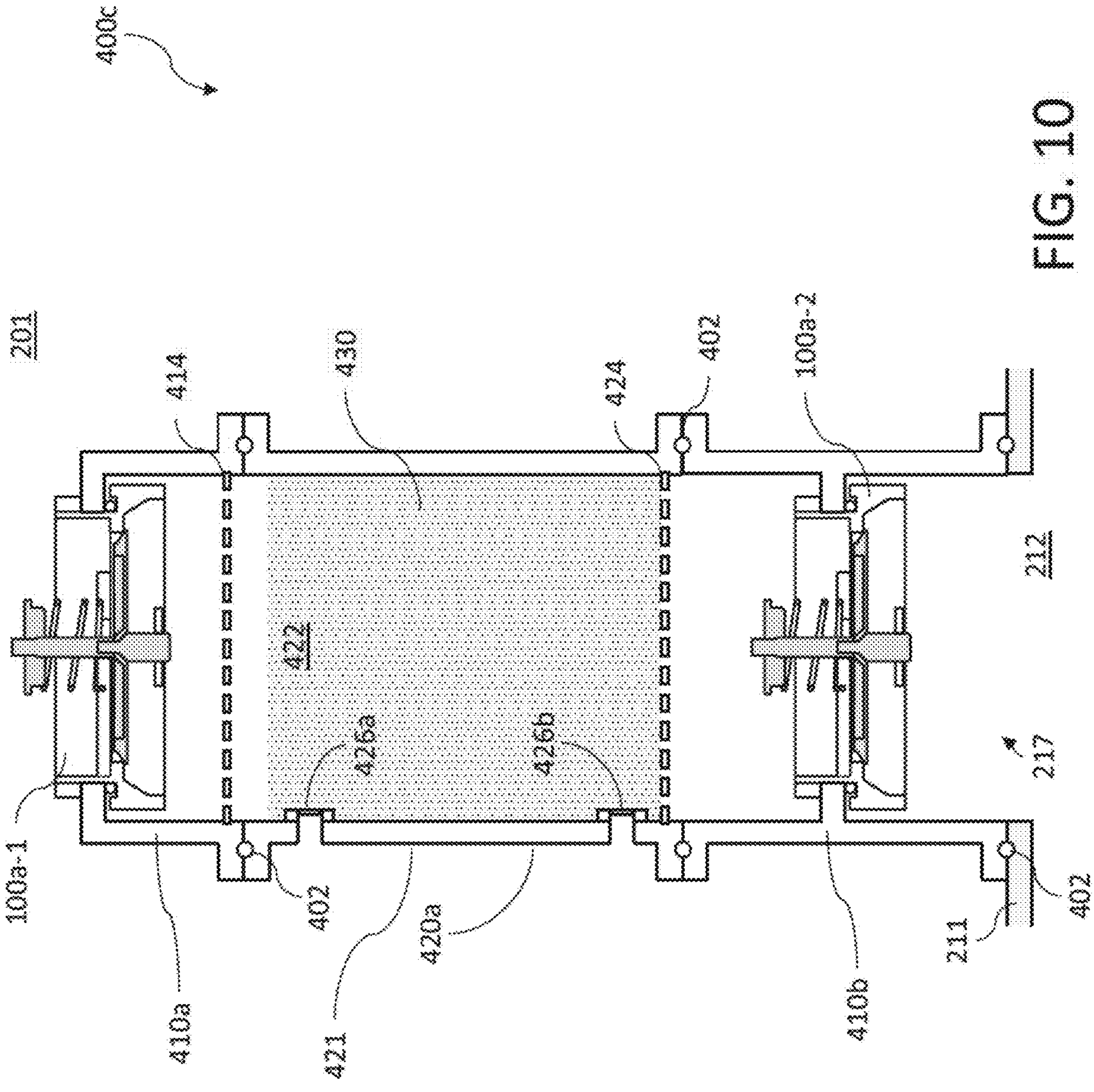
FIG. 10 shows a cross-sectional side view of another example inlet valve assembly that includes an adsorbent chamber and a pair of pressure relief valves of FIG. 2A coupled to opposite ends of the adsorbent chamber where one pressure relief valve is directly coupled to a tank of a two-phase immersion cooling system.

FIG. 10 shows an example inlet valve assembly 400*c* that includes valves 100*a*-1 and 100*a*-2 coupled to opposite ends of the adsorbent chamber 420*a* of FIG. 8 via respective valve chambers 410*a* and 410*b*. The inlet valve assembly 400*c* may share several of the same features as the outlet valve assembly 300*c*. For brevity, these details will not be repeated below unless otherwise indicated.

The combination of the valves 100*a*-1 and 100*a*-2 provide a way to seal the chamber volume 422 of the adsorbent chamber 420*a* when the tank 211 is not experiencing negative pressure conditions sufficient to open the valves 100*a*-1 and 100*a*-2. This, in turn, limits exposure of the desiccant 430 to moisture only when the valves 100*a*-1 and 100*a*-2 are open, thus extending the life of the desiccant 430. Additionally, the valve chamber 410*a* for the valve 100*a*-1 and the adsorbent chamber 420*a* may be more easily removed without affecting operation of the two-phase immersion cooling system. For example, if the valve 100*a*-2 is closed, the valve chamber 410*a* and the adsorbent chamber 420*a* may be removed without exposing the tank volume 212 to the ambient environment 201.

2. An Example Pressure Relief Valve with Two Poppets

Figure 11:
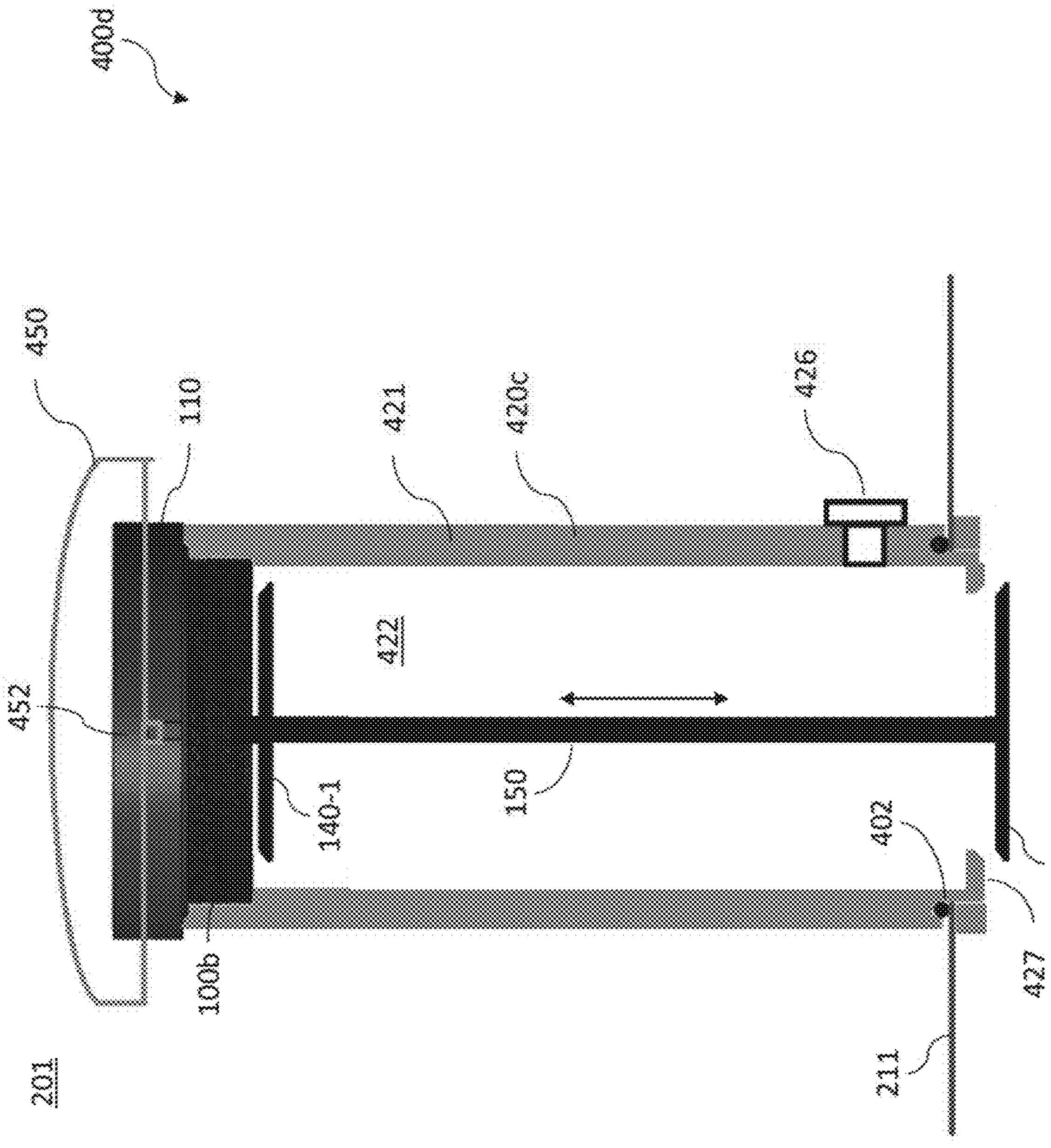
FIG. 11 shows a cross-sectional side view of another example inlet valve assembly that includes a pressure relief valve with two poppets.

In some implementations, the pressure relief valves disclosed herein may include more than one poppet to facilitate sealing of multiple chambers in an inlet valve assembly or an outlet valve assembly. For example, FIG. 11 shows an example inlet valve assembly 400*d* that includes a pressure relief valve 100*b* with a poppet assembly 140 that includes poppets 140-1 and 140-2. The inlet valve assembly 400*d* may share several of the same features as the inlet valve assembly 400*a*-400*c*. Similarly, the valve 100*b* may share several of the same features as the valve 100*a*. For brevity, these details will not be repeated below unless otherwise indicated.

As shown, the poppets 140-1 and 140-2 may be coupled together via an elongated stem 150 that spans the chamber volume 422 of an adsorbent chamber 420*c*. In some implementations, the poppets 140-1 and 140-2 may simultaneously open and/or close respective ends of the adsorbent chamber 422. The spring (not shown) of the valve 100*b* may apply a spring force to maintain both poppets 140-1 and 140-2 at a closed position. Thus, the poppet assembly 140 may only move from the closed position if an external force is applied to the poppets 140-1 and/or 140-2 in opposition to the spring force with a magnitude greater than the magnitude of the spring force. For example, the poppet assembly 140 of the valve 100*b* may move from a closed position when the ambient pressure applied to the poppet 140-1 is greater than the pressure within the chamber volume 422 and the pressure difference across the poppet 140-1 exceeds a pressure threshold determined by the spring. In this example, the poppet 140-1 may form a seal with a ledge of the valve body 110 (see, for example, the ledge 117 of the valve 100*a*). However, the poppet 140-2 may form a seal with a ledge 427 formed on an interior portion of the chamber wall 421 of the adsorbent chamber 420. In this manner, the chamber volume 422 may be sealed by the poppets 140-1 and 140-2.

Although the valve 100*b* is depicted as part of the inlet valve assembly 400*d* in FIG. 11, it should be appreciated the valve 100*b* may be integrated into an outlet valve assembly according to the implementations described above (see, for example, the outlet valve assemblies 300*a*-300*c*). For example, the valve 100*b* may be reversed in orientation such that the valve body 110 is disposed between the adsorbent chamber 420 and the tank 211.

3. Conclusion

All parameters, dimensions, materials, and configurations described herein are meant to be exemplary and the actual parameters, dimensions, materials, and/or configurations will depend upon the specific application or applications for which the inventive teachings is/are used. It is to be understood that the foregoing embodiments are presented primarily by way of example and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein.

In addition, any combination of two or more such features, systems, articles, materials, kits, and/or methods, if such features, systems, articles, materials, kits, and/or methods are not mutually inconsistent, is included within the inventive scope of the present disclosure. Other substitutions, modifications, changes, and omissions may be made in the design, operating conditions and arrangement of respective elements of the exemplary implementations without departing from the scope of the present disclosure. The use of a numerical range does not preclude equivalents that fall outside the range that fulfill the same function, in the same way, to produce the same result.

Also, various inventive concepts may be embodied as one or more methods, of which at least one example has been provided. The acts performed as part of the method may in some instances be ordered in different ways. Accordingly, in some inventive implementations, respective acts of a given method may be performed in an order different than specifically illustrated, which may include performing some acts simultaneously (even if such acts are shown as sequential acts in illustrative embodiments).

All publications, patent applications, patents, and other references mentioned herein are incorporated by reference in their entirety.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A two-phase immersion cooling system, comprising:
- a tank configured to contain a coolant liquid and one or more printed circuit boards having semiconductor die; and
- a one-way pressure relief valve, coupled to the tank, having an open position and a closed position, the valve being configured to remain in the closed position and only move from the closed position towards the open position when A) a pressure difference across the valve generates a net force directed towards the open position and B) the pressure difference is greater than a pressure threshold of the valve, wherein:
- the pressure threshold of the valve ranges from about 0.5 pounds per square inch (psi) to about 2 psi;
- when the valve is at the open position or between the open position and the closed position, the valve is configured to allow a fluid to flow through the valve at a rate ranging from about 0 cubic feet per minute (cfm) to about 2000 cfm; and
- at least one of:
  - the passage has a diameter ranging from about 2 inches to about 6 inches; or
  - the spring has a diameter ranging from about 1.5 inches to about 1.7 inches.

2. The system of claim 1, wherein the diameter of the passage ranges from about 2 inches to about 6 inches.

3. The system of claim 1, wherein the diameter of the spring ranges from about 1.5 inches to about 1.7 inches.

4. A two-phase immersion cooling system comprising:
- a tank configured to contain a coolant liquid and one or more printed circuit boards having semiconductor die; and
- a one-way pressure relief valve, coupled to the tank, having an open position and a closed position, the valve being configured to remain in the closed position and only move from the closed position towards the open position when A) a pressure difference across the valve generates a net force directed towards the open position and B) the pressure difference is greater than a pressure threshold of the valve, wherein the valve comprises:
  - a valve body defining a passage;
  - a poppet assembly coupled to the valve body and movable between and including the closed position and the open position, the poppet assembly comprising:
    - a poppet to seal the passage at the closed position; and
  - a spring, disposed between the valve body and the poppet assembly, to apply a spring force to the poppet assembly to keep the poppet assembly at the closed position, the pressure threshold corresponding to the spring force, wherein:

the pressure threshold of the valve ranges from about 0.5 pounds per square inch (psi) to about 2 psi; and when the valve is at the open position or between the open position and the closed position, the valve is configured to allow a fluid to flow through the valve at a rate ranging from about 0 cubic feet per minute (cfm) to about 2000 cfm.

5. The system of claim 4, wherein:

the valve further comprises:

a guide plate, coupled to the valve body, having a guide plate opening; and the poppet assembly further comprises:

a guide rod, securely coupled to the poppet and movable through the guide plate opening, to laterally constrain the poppet.

6. A two-phase immersion cooling system comprising:

a tank configured to contain a coolant liquid and one or more printed circuit boards having semiconductor die;

a one-way pressure relief valve, coupled to the tank, having an open position and a closed position, the valve being configured to remain in the closed position and only move from the closed position towards the open position when A) a pressure difference across the valve generates a net force directed towards the open position and B) the pressure difference is greater than a pressure threshold of the valve; and an adsorbent chamber coupled to and disposed between the tank and the valve, wherein:

the pressure threshold of the valve ranges from about 0.5 pounds per square inch (psi) to about 2 psi; and when the valve is at the open position or between the open position and the closed position, the valve is configured to allow a fluid to flow through the valve at a rate ranging from about 0 cubic feet per minute (cfm) to about 2000 cfm.

7. The system of claim 6, wherein the adsorbent chamber contains one of a desiccant or a filter.

8. The system of claim 1, wherein the valve is configured to be an outlet valve.

9. The system of claim 1, wherein the valve is configured to be an inlet valve.

10. The system of claim 1, wherein:

the valve is a first valve;

the system further comprises:

a second valve identical to the first valve; and the first valve is configured to be an outlet valve and the second valve is configured to be an inlet valve.

11. The system of claim 1, further comprising:

a bellows assembly, comprising:

a container defining a container volume configured to contain a mixture of air and coolant vapor from the tank volume; and a venting tube to fluidically couple the container to the tank.

12. The system of claim 11, wherein the valve is directly coupled to the bellows assembly.

13. A two-phase immersion cooling system, comprising:

a tank configured to contain a coolant liquid and one or more printed circuit boards having semiconductor die; and a one-way pressure relief valve coupled to the tank, the valve comprising:

a valve body defining a passage;

a guide plate, coupled to the valve body, having a guide plate opening;

a poppet assembly coupled to the valve body and movable between and including a closed position and an open position, the poppet assembly comprising:

a poppet to seal the passage at the closed position; and a guide rod, securely coupled to the poppet and movable through the guide plate opening, to laterally constrain the poppet; and a spring, disposed between the valve body and the poppet assembly, to apply a spring force to the poppet assembly to keep the poppet assembly at the closed position unless a pressure difference across the poppet generates a net force that opposes the spring force and is greater than or equal to a pressure threshold corresponding to the spring force.

14. The system of claim 13, wherein the pressure threshold ranges from about 0.5 pounds per square inch (psi) to about 2 psi.

15. The system of claim 13, wherein when the poppet assembly is at the open position or between the open position and the closed position, the valve is configured to allow a fluid to flow through the valve at a rate ranging from about 0 cubic feet per minute (cfm) to about 2000 cfm.

16. The system of claim 13, wherein the passage has a diameter ranging from about 2 inches to about 6 inches.

17. The system of claim 13, wherein the spring has a diameter ranging from about 1.5 inches to about 1.7 inches.

18. A two-phase immersion cooling system, comprising:

a tank configured to contain a coolant liquid and one or more printed circuit boards having semiconductor die; and a one-way pressure relief valve, coupled to the tank, having an open position and a closed position, the valve being configured to remain in the closed position and only move from the closed position towards the open position when A) a pressure difference across the valve generates a net force directed towards the open position and B) the pressure difference is greater than a pressure threshold of the valve, wherein:

the pressure threshold of the valve ranges from about 0.5 pounds per square inch (psi) to about 2 psi; and the valve defines a passage for a fluid to flow through the valve at the open position or between the open position and the closed position, the passage having a diameter ranging from about 2 inches to about 6 inches.

19. The system of claim 18, wherein:

when the valve is at the open position or between the open position and the closed position, the valve is configured to allow a fluid to flow through the valve at a rate ranging from about 0 cubic feet per minute (cfm) to about 2000 cfm; and the spring has a diameter ranging from about 1.5 inches to about 1.7 inches.

20. The system of claim 18, wherein the valve comprises:

a valve body defining a passage;

a guide plate, coupled to the valve body, having a guide plate opening;

a poppet assembly coupled to the valve body and movable between and including the closed position and the open position, the poppet assembly comprising:

a poppet to seal the passage at the closed position; and a guide rod, securely coupled to the poppet and movable through the guide plate opening, to laterally constrain the poppet; and a spring, disposed between the valve body and the poppet assembly, to apply a spring force to the poppet assembly to keep the poppet assembly at the closed position, the pressure threshold corresponding to the spring force.

* * * * *